(12) United States Patent
Noh et al.

(10) Patent No.: US 11,561,571 B2
(45) Date of Patent: Jan. 24, 2023

(54) STORAGE DEVICE AND STORAGE SYSTEM INCLUDING THE SAME

(71) Applicant: Samsung Electronics Co., Ltd., Suwon-si (KR)

(72) Inventors: Kwanwoo Noh, Seoul (KR); Sungho Seo, Suwon-si (KR); Yongwoo Jeong, Seoul (KR); Dongwoo Nam, Seongnam-si (KR); Myungsub Shin, Suwon-si (KR); Hyunkyu Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/179,830

(22) Filed: Feb. 19, 2021

(65) Prior Publication Data

US 2021/0263550 A1   Aug. 26, 2021

(30) Foreign Application Priority Data

Feb. 20, 2020   (KR) ........................ 10-2020-0021205
Oct. 5, 2020    (KR) ........................ 10-2020-0128277

(51) Int. Cl.
*G06F 1/08* (2006.01)
*G06F 3/06* (2006.01)
*G11C 7/22* (2006.01)
*G11C 16/32* (2006.01)
*G06F 1/04* (2006.01)
*G06F 13/42* (2006.01)
*H04L 7/00* (2006.01)

(52) U.S. Cl.
CPC .................. *G06F 1/08* (2013.01); *G06F 1/04* (2013.01); *G06F 3/0632* (2013.01); *G06F 3/0658* (2013.01); *G06F 3/0679* (2013.01); *G06F 13/4291* (2013.01); *G11C 7/22* (2013.01); *G11C 16/32* (2013.01); *H04L 7/0004* (2013.01); *H04L 7/0008* (2013.01)

(58) Field of Classification Search
CPC . G06F 1/08; G06F 1/04; G06F 3/0679; G06F 3/0632; G06F 3/0658; G06F 13/4291; G11C 7/22; G11C 16/32; H04L 7/0004; H04L 7/0008
See application file for complete search history.

(56) References Cited

U.S. PATENT DOCUMENTS 6,686,803 B1   2/2004  Perrott et al.
7,149,127 B2   12/2006 Kikuchi
(Continued)

OTHER PUBLICATIONS

Extended European Search Report dated Jun. 24, 2021 issued in corresponding European Patent Application No. 21151346.0-1203.

*Primary Examiner* — Glenn A. Auve
(74) *Attorney, Agent, or Firm* — Harness, Dickey & Pierce, P.L.C.

(57) ABSTRACT

A storage device and a storage system including the same are provided. The storage device includes a reference clock pin configured to receive a reference clock signal from a host, a reference clock frequency determination circuitry configured to determine a reference clock frequency from the reference clock signal received through the reference clock pin, and a device controller circuitry configured to perform a high speed mode link startup between the host and the storage device according to the reference clock frequency.

20 Claims, 30 Drawing Sheets

(56) References Cited

U.S. PATENT DOCUMENTS

| | | | |
|---|---|---|---|
| 9,318,163 B2 | 4/2016 | Eguchi et al. | |
| 9,904,651 B2 | 2/2018 | Park | |
| 10,304,546 B2* | 5/2019 | Han | G11C 16/20 |
| 10,310,580 B2 | 6/2019 | Chi et al. | |
| 2009/0195271 A1 | 8/2009 | Boomer | |
| 2016/0005488 A1 | 1/2016 | Han et al. | |
| 2016/0269034 A1* | 9/2016 | Winemiller | G06F 1/12 |
| 2018/0059159 A1 | 3/2018 | Hsu et al. | |
| 2018/0090191 A1* | 3/2018 | Jeong | G11C 7/1045 |
| 2019/0018615 A1 | 1/2019 | Kim et al. | |
| 2019/0043545 A1 | 2/2019 | Boehm | |

* cited by examiner

| FREQUENCY VALUE [MHz] | REF_CLK_FRQ |
|---|---|
| 19.2 | 00 |
| 26 | 01 |
| 38.4 | 10 |
| 52 | 11 |

| OPERATION MODE | MD |
|---|---|
| LOW SPEED MODE | 0 |
| HIGH SPEED MODE | 1 |

| GEAR GATE | GS |
|---|---|
| HS-GEAR1 | 000 |
| HS-GEAR2 | 001 |
| HS-GEAR3 | 010 |
| HS-GEAR4 | 011 |
| PWM-G1 | 100 |
| ... | ... |

STORAGE DEVICE AND STORAGE SYSTEM INCLUDING THE SAME

CROSS-REFERENCE TO RELATED APPLICATIONS

This application is based on and claims priority under 35 U.S.C. § 119 to Korean Patent Application Nos. 10-2020-0021205, filed on Feb. 20, 2020 and 10-2020-0128277, filed on Oct. 5, 2020, in the Korean Intellectual Property Office, the disclosures of each of which are incorporated by reference herein in their entirety.

BACKGROUND

Inventive concepts relate to a memory device, and more particularly, to a storage device and/or a storage system including the same.

A storage system includes a host and a storage device. The host is connected to the storage device through various standard interfaces such as at least one of a universal flash storage (UFS) interface, a serial advanced technology attachment (SATA) interface, a small computer small interface (SCSI), a serial attached SCSI (SAS), and an embedded multimedia card (eMMC) interface. When the storage system is used in a mobile device, high-speed operations between the host and the storage device are very important, and a quick linkup between the host and the storage device is required/desired.

SUMMARY

According to some example embodiments of inventive concepts, there is provided a storage device including a reference clock pin configured to receive a reference clock signal from a host, a reference clock frequency determination circuitry configured to determine a reference clock frequency from the reference clock signal received through the reference clock pin, and a device controller circuitry configured to perform a high speed mode link startup between the host and the storage device according to the reference clock frequency.

According to some example embodiments of inventive concepts, there is provided a storage device including a reference clock pin configured to receive a reference clock signal from a host, a reference clock frequency determination circuitry configured to determine a reference clock frequency from the reference clock signal received through the reference clock pin, and a device controller circuitry configured, in response to the reference clock frequency changing from a first reference clock frequency to a second reference clock frequency in a linkup state between the host and the storage device, to dynamically change a speed gear between the host and the storage device according to the second reference clock frequency.

According to some example embodiments of inventive concepts, there is provided a storage device including a reference clock pin configured to receive a reference clock signal from a host, a control signal pin configured to receive a control signal from the host, and a device controller circuitry configured to perform a high speed mode link startup between the host and the storage device according to the control signal and/or to change a speed gear between the host and the storage device according to the control signal.

According to some example embodiments of inventive concepts, there is provided a storage device including a reference clock pin configured to receive a reference clock signal from a host, a reference clock detection circuitry configured to detect whether the reference clock signal is received through the reference clock pin, and a device controller circuitry configured, in response to the reference clock signal received through the reference clock pin, to perform a high speed mode link startup between the host and the storage device during initialization and/or booting of the storage device.

BRIEF DESCRIPTION OF THE DRAWINGS

Some example embodiments of inventive concepts will be more clearly understood from the following detailed description taken in conjunction with the accompanying drawings in which:

FIGS. 21 through 23 are tables of control signals, according to some embodiments;

DETAILED DESCRIPTION OF EXAMPLE EMBODIMENTS

Hereinafter, embodiments will be described in detail with reference to the accompanying drawings.

Figure 1:
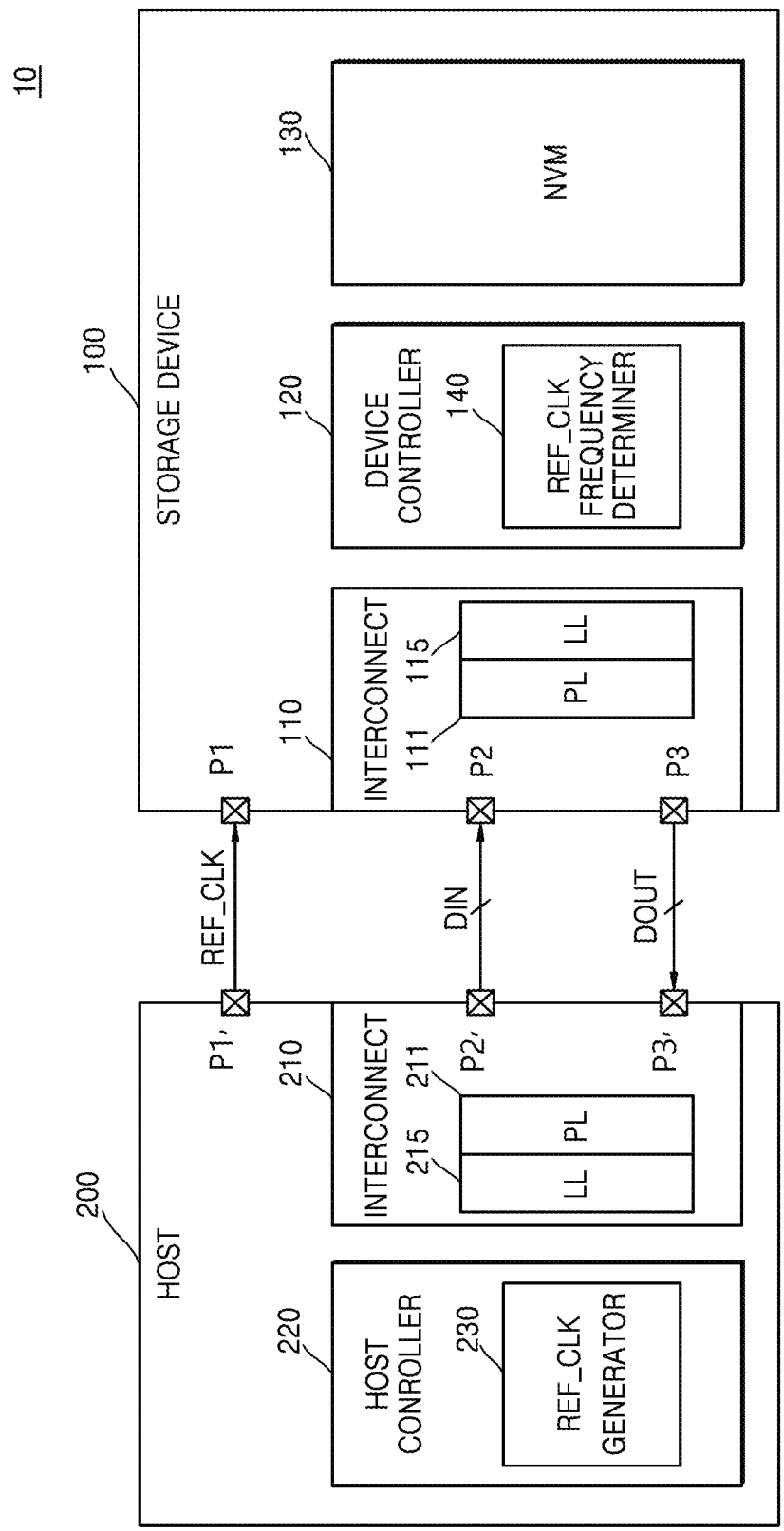
FIG. 1 is a block diagram of a storage system according to some example embodiments.

FIG. 1 is a block diagram of a storage system 10 according to some example embodiments.

Referring to FIG. 1, the storage system 10 includes a storage device 100 and a host 200. For example, the storage device 100 may be connected to the host 200 according to an interface protocol defined in universal flash storage (UFS) standards, and accordingly, the storage device 100 may include a UFS device and the host 200 may include a UFS host. However, example embodiments are not limited thereto, and the storage device 100 may be connected to the host 200 according to various standard interfaces.

The host 200 may control a data processing operation, e.g., a data read operation and/or a data write operation, with respect to the storage device 100. The host 200 may refer to a data processing device, such as a central processing unit (CPU), a processor, a microprocessor, and/or an application processor (AP), which may process data. The host 200 may execute an operating system (OS) and/or various applications. In some example embodiments, the storage system 10 may be included in a mobile device, and the host 200 may be implemented as an AP. In some example embodiments, the host 200 may be implemented as a system-on-a-chip (SoC) and thus may be included in an electronic device.

The host 200 may include an interconnect unit 210 and a host controller 220. The host 200 may further include a reference clock generator 230 generating a reference clock signal REF_CLK, and may provide the reference clock signal REF_CLK to the storage device 100. Although the host controller 220 includes the reference clock generator 230 in FIG. 1, example embodiments are not limited thereto; for example the reference clock generator 230 may be external to the host controller 220.

The reference clock generator 230 may generate the reference clock signal REF_CLK, and the reference clock signal REF_CLK may have one of various frequencies. For example, one of various frequencies such as 19.2 MHz, 26 MHz, 38.4 MHz, and 52 MHz may be determined as the frequency of the reference clock signal REF_CLK. In some example embodiments, four frequencies, e.g., 19.2 MHz, 26 MHz, 38.4 MHz, and 52 MHz, may be provided as selectable frequencies for the reference clock signal REF_CLK, but embodiments are not limited thereto. In some example embodiments, the number of selectable frequencies for the reference clock signal REF_CLK may be less or greater than four.

In some example embodiments, the reference clock generator 230 may generate the reference clock signal REF_CLK during the initialization and/or booting of the storage system 10, and may provide the reference clock signal REF_CLK to the storage device 100. In some example embodiments, the reference clock generator 230 may continuously generate the reference clock signal REF_CLK during the operation of the storage system 10 and continuously provide the reference clock signal REF_CLK to the storage device 100. In some example embodiments, the reference clock generator 230 may change the frequency of the reference clock signal REF_CLK during the operation of the storage system 10 and provide the reference clock signal REF_CLK having a changed frequency to the storage device 100.

The storage device 100 may include an interconnect unit 110, a device controller 120, and a volatile, or non-volatile memory (NVM) 130. The device controller 120 may control the NVM 130 in response to a write request from the host 200 such that data is written to the NVM 130 and/or control the NVM 130 in response to a read request from the host 200 such that data is read from the NVM 130. The storage device 100 may further include a reference clock frequency determiner 140. Although the device controller 120 includes the reference clock frequency determiner 140 in FIG. 1, embodiments are not limited thereto; for example, the reference clock frequency determiner 140 may be external to the device controller 120.

Although the interconnect unit 110 is separated from the device controller 120 in FIG. 1, the device controller 120 may include the interconnect unit 110, as described with reference to other drawings below. For example, when the device controller 120 is implemented as a single package chip, the interconnect unit 110 may also be implemented in the package chip.

The reference clock frequency determiner 140 may determine the frequency of the reference clock signal REF_CLK received from the host 200. When power is supplied to the storage system 10, the host 200 may provide the reference clock signal REF_CLK to the storage device 100, and the reference clock frequency determiner 140 may receive the reference clock signal REF_CLK and determine the frequency of the reference clock signal REF_CLK. Accordingly, the storage device 100 does not need to or does not separately receive frequency information of the reference clock signal REF_CLK from the host 200.

The storage device 100 may perform a link startup between the host 200 and the storage device 100 in a high-speed mode by using the determined frequency of the reference clock signal REF_CLK. Accordingly, a time taken for the link startup may be reduced and the host 200 and the storage device 100 may be quickly set to a linkup state, and therefore, the performance of the storage system 10 may be enhanced. The detailed operations of the reference clock frequency determiner 140 will be described with reference to FIGS. 4 through 19 below. In some example embodiments, the device controller 120 may determine the frequency of the reference clock signal REF_CLK using a side band signal.

The NVM 130 may include a plurality of memory cells, e.g., flash memory cells. In some example embodiments, the memory cells may include NAND flash memory cells. However, example embodiments are not limited thereto. In some example embodiments, the memory cells may include resistive memory cells such as at least one of resistive random access memory (RRAM) cells, phase-change RAM (PRAM) cells, or magnetic RAM (MRAM) cells.

The host 200 may further include a first pin P1' and may transmit the reference clock signal REF_CLK to the storage device 100 through the first pin P1'. The storage device 100 may further include a first pin P1 configured to connect to the first pin P1' and may receive the reference clock signal REF_CLK from the host 200 through the first pin P1. As described above, because the reference clock signal REF_CLK may be transmitted from the host 200 to the storage device 100 through the first pins P1' and P1, the first pins P1' and P1 may be referred to as "reference clock pins".

In some example embodiments, the storage device 100 may receive the reference clock signal REF_CLK from the host 200 through the first pin P1 during the initialization and/or booting of the storage device 100.

The host 200 may further include other pins such as a plurality of or one each of a second pin P2' and a third pin P3', and the storage device 100 may further include other pins such as a plurality of or one each of a second pin P2 and a third pin P3, which are configured to respectively connect to the second pin P2' and the third pin P3'. Because the host 200 may transmit an input signal DIN to the storage device 100 through the second pins P2' and P2, the second pins P2' and P2 may be referred to as "input signal pins". In some example embodiments, the input signal DIN may include differential input signals, and accordingly, the host 200 may include two second pins P2' and the storage device 100 may include two second pins P2. Because the storage device 100 may transmit an output signal DOUT to the host 200 through the third pins P3' and P3, the third pins P3' and P3 may be referred to as "output signal pins". In some example embodiments, the output signal DOUT may include differential output signals, and accordingly, the host 200 may include two third pins P3' and the storage device 100 may include two third pins P3.

The interconnect units 110 and 210 may provide an interface for data exchange between the host 200 and the storage device 100. In some example embodiments, the interconnect unit 110 may include a physical layer (PL) 111 and a (data) link layer (LL) 115. The PL 111 may connect to the second and third pins P2 and P3. Similarly, the interconnect unit 210 may include a PL 211 and an LL 215. The PL 211 may connect to the second and third pins P2' and P3'. Each of the PLs 111 and 211 may include physical components for data exchange between the host 200 and the storage device 100. For example, each of the PLs 111 and 211 may include at least one transmitter and at least one receiver or at least one transceiver. Each of the LLs 115 and 215 may manage the transmission and/or composition of data, and/or also manage the integrity and error of the data.

In some example embodiments, when the storage system 10 is or includes a mobile device, the LLs 115 and 215 may be defined by the Unified Protocol (UniPro) specification, and the PLs 111 and 211 may be defined by the M-PHY specification. UniPro and M-PHY are interface protocols introduced by Mobile Industry Processor Interface (MIPI) Alliance. At this time, each of the LLs 115 and 215 may include a physical adapted layer. The physical adapted layer may control the PLs 111 and 211 by managing the symbol of data and/or power. Hereinafter, an interface between the host 200 and the storage device 100 will be described in detail with reference to FIG. 2 below.

Figure 2:
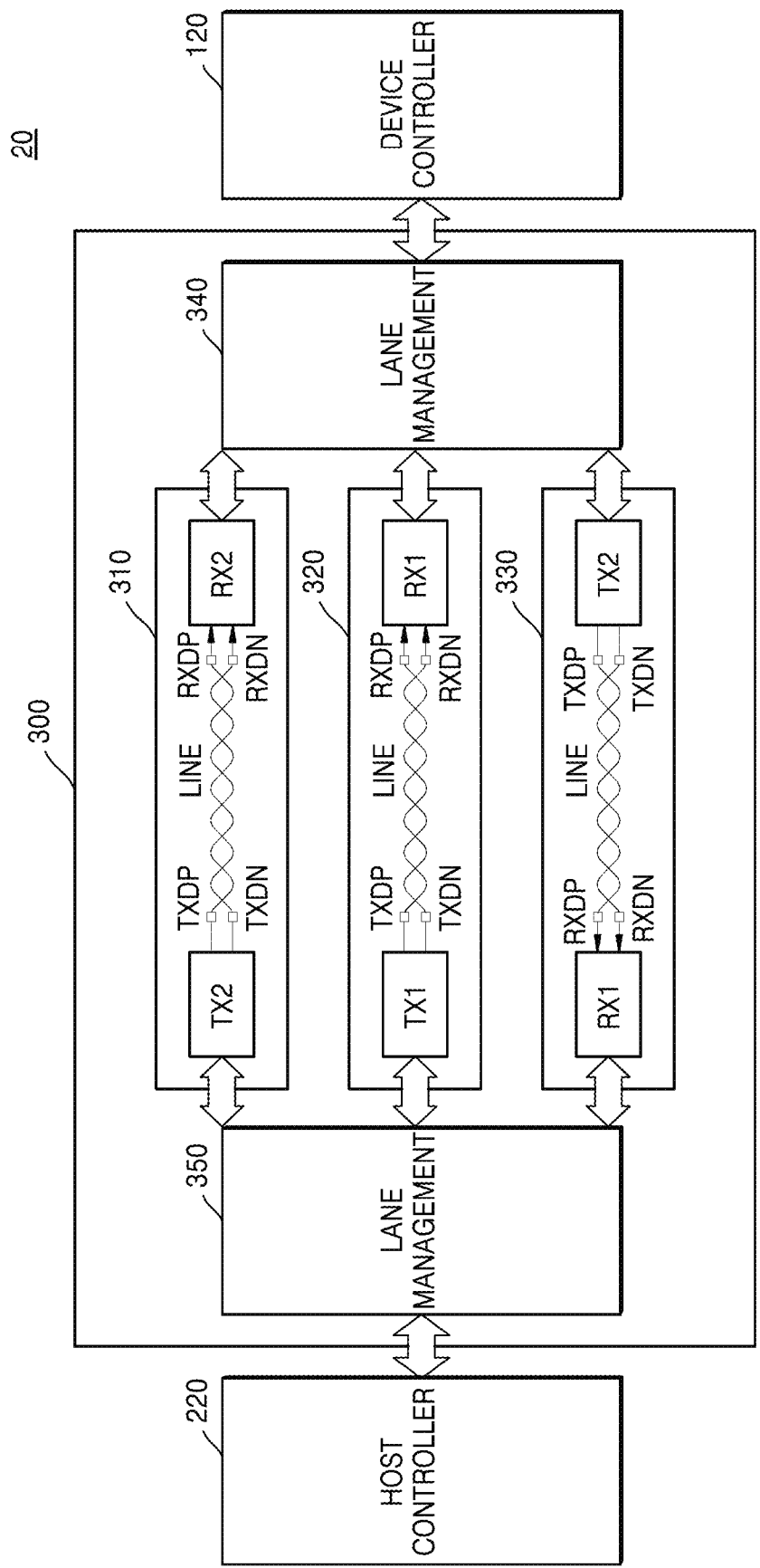
FIG. 2 illustrates an interface between a host and a storage device, according to some example embodiments.

FIG. 2 illustrates an interface 20 between a host and a storage device, according to some example embodiments.

Referring to FIG. 2, the interface 20 may include a link 300 between the host controller 220 and the device controller 120. The link 300 may include a plurality of lanes 310, 320, and 330. The link 300 may include at least one lane corresponding to each direction, and the numbers of lanes corresponding to different directions may not be symmetrical. For example, the link 300 may include two lanes 310 and 320 corresponding to a first direction from the host controller 220 to the device controller 120 and one lane 330 corresponding to a second direction from the device controller 120 to the host controller 220, but embodiments are not limited thereto.

Each of the lanes 310, 320, and 330 includes a transmission channel that carries unidirectional and single-signal information. For example, the lane 320 may include a transmitter TX1, a receiver RX1, and a line interconnecting the transmitter TX1 to the receiver RX1 using a point-to-point link. For example, the transmitter TX1 may connect to a pin TXDP corresponding to a positive node of a differential signal and a pin TXDN corresponding to a negative node of the differential signal, and the receiver RX1 may connect to a pin RXDP corresponding to the positive node of the differential signal and a pin RXDN corresponding to the negative node of the differential signal. The line may include two differentially-routed wires respectively connecting the pins TXDP and TXDN of the transmitter TX1 to the pins RXDP and RXDN of the receiver RX1. The wires may correspond to transmission lines.

The link 300 may further include lane management units 340 and 350 providing bidirectional data transmission. Although the lane management unit 350 is separated from the host controller 220 in FIG. 2, example embodiments are not limited thereto; for example, the lane management unit 350 may be included in the host controller 220. Similarly, the lane management unit 340 is separated from the device controller 120 in FIG. 2, but example embodiments are not limited thereto; for example, the lane management unit 340 may be included in the device controller 120.

Referring to FIGS. 1 and 2, a transmitter included in the interconnect unit 210 of the host 200 and a receiver included in the interconnect unit 110 of the storage device 100 may form a single lane. The numbers of transmitters and receivers included in the interconnect unit 210 of the host may be different from the numbers of transmitters and receivers included in the interconnect unit 110 of the storage device 100. The capability of the host 200 may be different from that of the storage device 100.

Accordingly, the host 200 and the storage device 100 recognize a lane physically connected therebetween and perform processing for receiving each other's information. The host 200 and the storage device 100 perform link startup processing before exchanging data with each other. The host 200 and the storage device 100 may exchange and recognize information about the numbers of transmitters and receivers, information about a lane physically connected to each other, information about the capability of each other, and the like by performing the link startup processing. After the link startup processing is completed, the host 200 and the storage device 100 are set to a linkup state, in which the host 200 and the storage device 100 may reliably exchange data with each other.

The link startup processing may be performed during initialization performed when the storage system 10 is initially used, and/or during the booting of the storage system 10. Furthermore, the link startup processing may also be performed during a recovery from an error in the linkup state. The link startup processing requires exchange of an amount, e.g. a large amount of information about the host 200 and the storage device 100 and may thus take a long time. In particular, the link startup processing is performed in a low-speed mode before the storage device 100 acquires information about the frequency of a reference clock signal and may thus take a long time. The link startup processing taking a long time as described above may degrade the performance of the storage system 10.

However, according to some example embodiments, the host 200 may provide the reference clock signal REF_CLK to the storage device 100 during the initialization and/or booting of the storage system 10, and the storage device 100 may determine the frequency of the reference clock signal REF_CLK and thus perform link startup processing in a high-speed mode without receiving information about the frequency of the reference clock signal REF_CLK from the host 200. Accordingly, a time taken for the link startup processing may be reduced, and therefore, the performance of the storage system 10 may be enhanced.

In some example embodiments, the storage device 100 may be implemented as a device without any volatile memory, such as a DRAMless device, and the DRAMless device may refer to a device that does not include a dynamic RAM (DRAM) cache. At this time, the device controller 120 may not include a DRAM controller. For example, the storage device 100 may use a portion of the NVM 130 as a buffer memory.

In some example embodiments, the storage device 100 may include an internal memory embedded in an electronic device. For example, the storage device 100 may include an embedded UFS memory device, an embedded multimedia card (eMMC), or a solid state drive (SSD). However, example embodiments are not limited thereto. The storage device 100 may include NVM, e.g., at least one of one time programmable read-only memory (OTPROM), programmable ROM (PROM), erasable and programmable ROM (EPROM), electrically erasable and programmable ROM (EEPROM), mask ROM, or flash ROM. In some example embodiments, the storage device 100 may include an external memory removable from an electronic device. For example, the storage device 100 may include at least one selected from a UFS memory card, a compact flash (CF) card, a secure digital (SD) card, a micro-SD card, a mini-SD card, an extreme digital (xD) card, and a memory stick.

The storage system 10 may be implemented as an electronic device such as a at least one of a personal computer (PC), a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device or portable navigation device (PND), an MP3 player, a handheld game console, or an e-book. The storage system 10 may be implemented in various types of electronic devices including a wearable device such as a watch or a head-mounted display (HMD).

Figure 3:
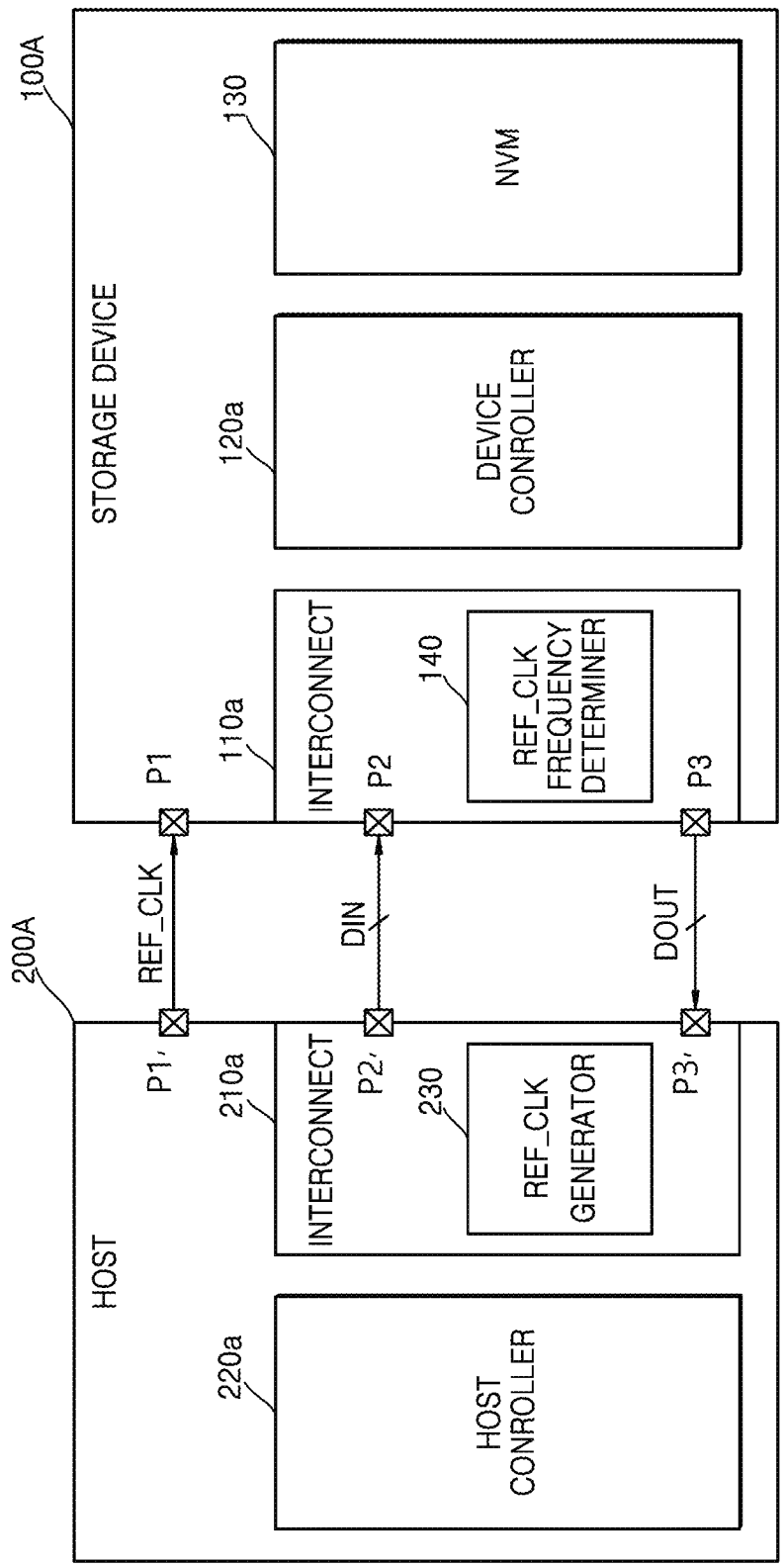
FIG. 3 is a block diagram of a storage system according to some example embodiments.

FIG. 3 is a block diagram of a storage system 10A according to some example embodiments.

Referring to FIG. 3, the storage system 10A may include a storage device 100A and a host 200A. The storage device 100A may include an interconnect unit 110a, a device controller 120a, and the NVM 130. The host 200A may include an interconnect unit 210a and a host controller 220a. The storage system 10A may correspond to a modification of the storage system 10 of FIG. 1, and the description given above with reference to FIGS. 1 and 2 may also be applied to FIG. 3. In some example embodiments, the reference clock generator 230 may be included in the interconnect unit 210a. For example, the reference clock generator 230 may be included in a physical layer (e.g., the PL 211 in FIG. 1) of the interconnect unit 210a. The reference clock frequency determiner 140 may be included in the interconnect unit 110a. For example, the reference clock frequency determiner 140 may be included in a physical layer (e.g., the PL 111 in FIG. 1) of the interconnect unit 110a.

Figure 4:
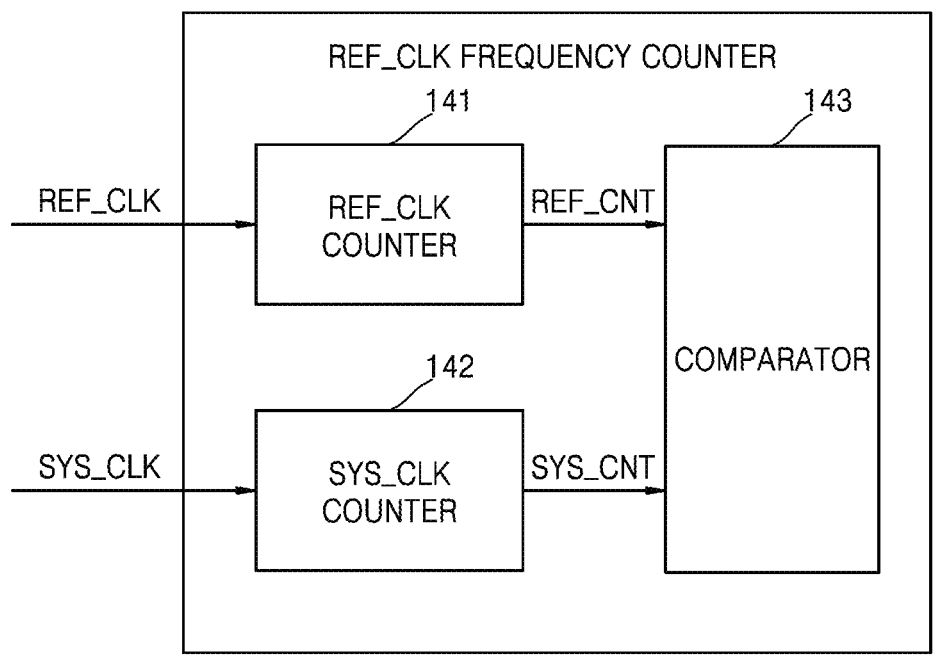
FIG. 4 is a block diagram of a reference clock frequency counter according to some example embodiments.
Figure 5:
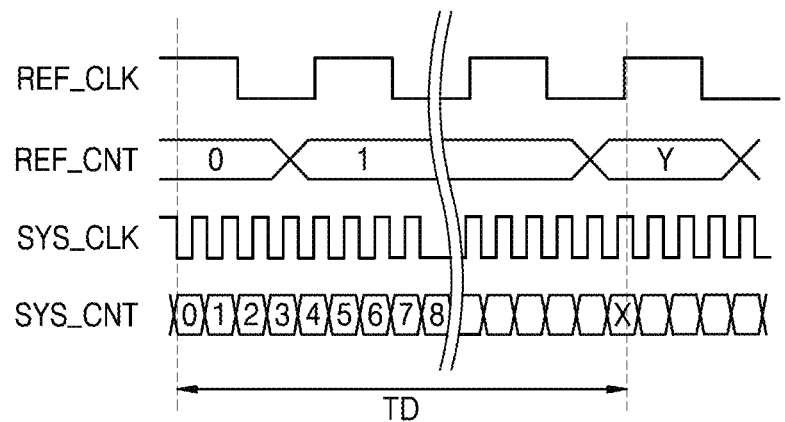
FIG. 5 is a timing diagram illustrating a counting operation of the reference clock frequency counter of FIG. 4, according to some example embodiments.

FIG. 4 is a block diagram of a reference clock frequency counter 140a according to some example embodiments. FIG. 5 is a timing diagram illustrating a counting operation of the reference clock frequency counter 140a of FIG. 4, according to some example embodiments.

Referring to FIGS. 4 and 5, the reference clock frequency counter 140a may include a reference clock counter 141, a system clock counter 142, and a comparator 143, and may correspond to a modification of the reference clock frequency determiner 140 in FIG. 1. Here, the reference clock signal REF_CLK may be received from the host 200 through the first pin P1, and a system clock signal SYS_CLK may correspond to an internal clock signal generated in the storage device 100.

The reference clock counter 141 may generate a reference clock count value REF_CNT by counting the number of clocks in the reference clock signal REF_CLK during a frequency determination period TD. The reference clock signal REF_CLK may toggle according to a first frequency, and the reference clock counter 141 may generate, for example, Y as the reference clock count value REF_CNT by counting the number of clocks (e.g. the number of transitions of the clocks) in the reference clock signal REF_CLK.

The system clock counter 142 may generate a system clock count value SYS_CNT by counting the number of clocks in the system clock signal SYS_CLK during the frequency determination period TD. The system clock signal SYS_CLK may toggle according to a second frequency, and the system clock counter 142 may generate, for example, X as the system clock count value SYS_CNT by counting the number of clocks in the system clock signal SYS_CLK.

The comparator 143 may compare the reference clock count value REF_CNT, e.g., a count value Y, received from the reference clock counter 141 with the system clock count value SYS_CNT, e.g., a count value X, received from the system clock counter 142 and may determine a reference clock frequency. The storage device 100 may perform a link startup operation between the host 200 and the storage device 100 in a high-speed mode based on the reference clock frequency. For example, the LL 115 of the storage device 100 may acquire reference clock frequency information.

In some example embodiments, the reference clock frequency counter 140a may determine the frequency of the reference clock signal REF_CLK for a link startup operation between the host 200 and the storage device 100. For example, when power is supplied from the host 200 to the storage device 100, the device controller 120 may apply an enable signal and/or a reset signal to the reference clock counter 141 and the system clock counter 142 so that the reference clock counter 141 and the system clock counter 142 may perform a counting operation. The comparator 143 may determine the frequency of the reference clock signal REF_CLK based on the count values X and Y respectively received from the system clock counter 142 and the reference clock counter 141.

In some example embodiments, the reference clock frequency counter 140a may determine the frequency of the reference clock signal REF_CLK in the linkup state of the host 200 and the storage device 100. For example, the host 200 may change the frequency of the reference clock signal REF_CLK to perform a high-speed operation. At this time, the device controller 120 may apply a reset signal to the reference clock counter 141 and the system clock counter 142 so that the reference clock counter 141 and the system clock counter 142 may perform a new counting operation. The comparator 143 may determine the changed frequency of the reference clock signal REF_CLK based on the count values X and Y respectively received from the system clock counter 142 and the reference clock counter 141.

Figure 6:
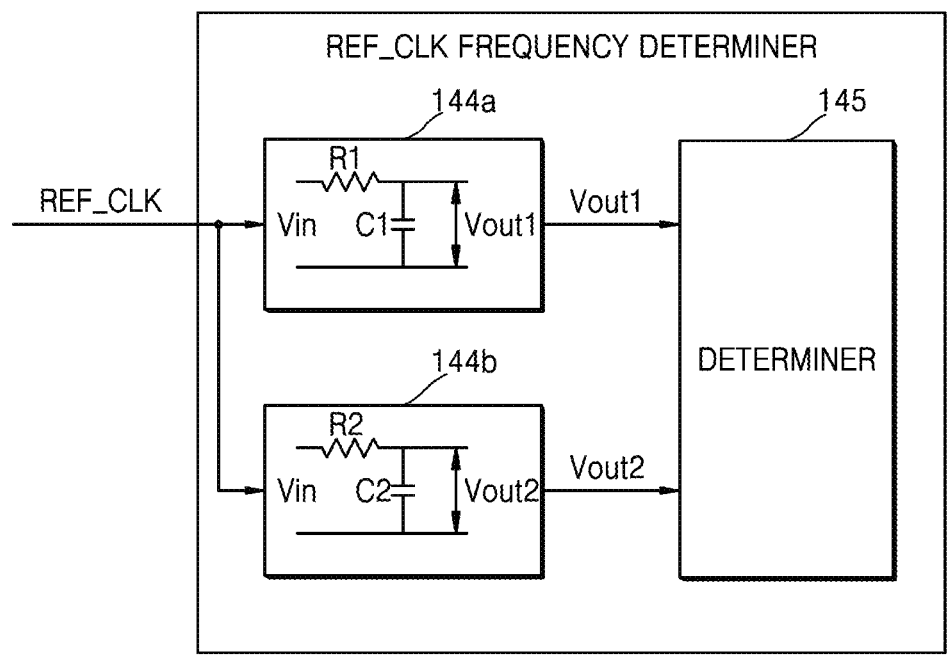
FIG. 6 is a block diagram of a reference clock frequency determiner according to some example embodiments.

FIG. 6 is a block diagram of a reference clock frequency determiner 140b according to some example embodiments.

Referring to FIGS. 1 and 6, the reference clock frequency determiner 140b may include a first resistor-capacitor (RC)

filter 144a (e.g. a low-pass filter), a second RC filter 144b (e.g. a low-pass filter), and a determiner 145 and may correspond to an example of the reference clock frequency determiner 140 in FIG. 1. In some example embodiments, the first RC filter 144a and the second RC filter 144b may be included in the PL 111 of the interconnect unit 110. In some example embodiments, the first RC filter 144a and the second RC filter 144b may be included in the device controller 120.

The first RC filter 144a may include a first resistor R1 and a first capacitor C1 and may generate a first output voltage Vout1 from the reference clock signal REF_CLK received as an input voltage Vin. The second RC filter 144b may include a second resistor R2 and a second capacitor C2 and may generate a second output voltage Vout2 from the reference clock signal REF_CLK received as the input voltage Vin. The determiner 145 may receive the first output voltage Vout1 and the second output voltage Vout2, and may determine a reference clock frequency based on the first and second output voltages Vout1 and Vout2.

Figure 8:
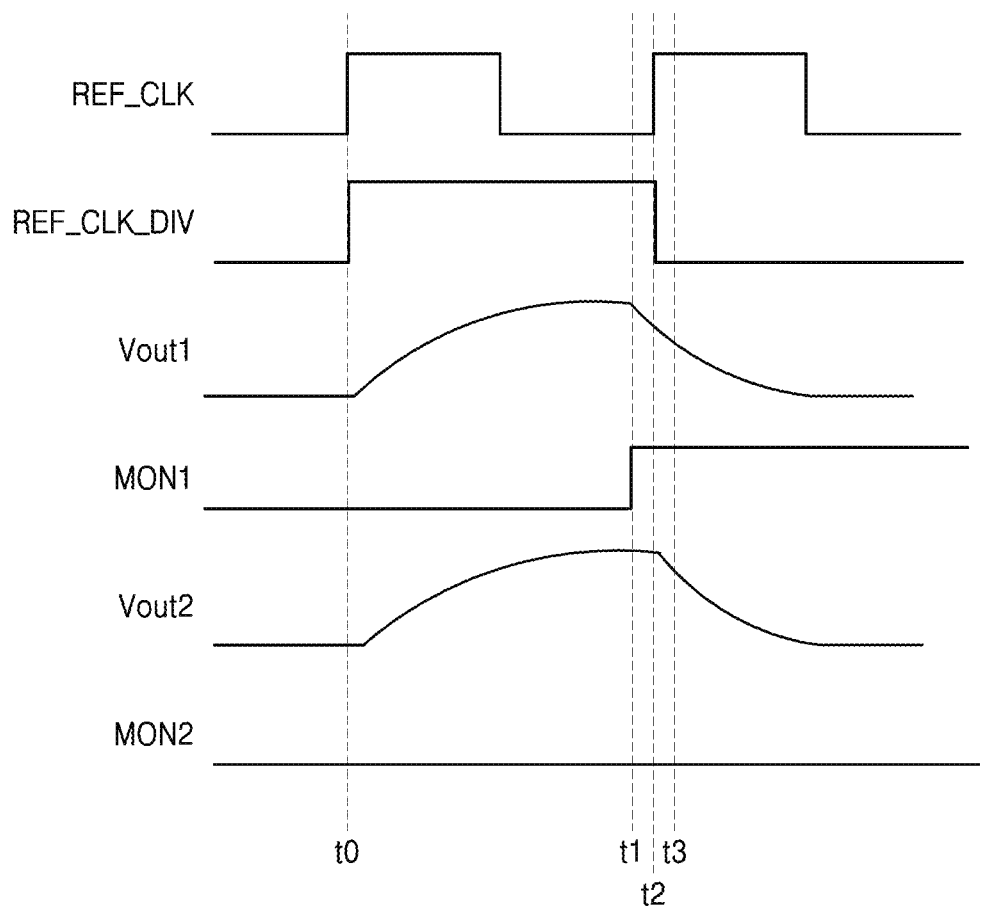
FIG. 8 is a timing diagram illustrating a frequency determination operation of the reference clock frequency determiner of FIG. 7, according to some example embodiments.

In detail, the first RC filter 144a may detect the first output voltage Vout1 corresponding to the reference clock signal REF_CLK at a first time point (e.g., t1 in FIG. 8). For example, the first time point may correspond to a first time constant based on a resistance of the first resistor R1 and a capacitance of the first capacitor C1. The second RC filter 144b may detect the second output voltage Vout2 corresponding to the reference clock signal REF_CLK at a second time point (e.g., t2 in FIG. 8), which is different from the first time point. For example, the second time point may correspond to a second time constant based on a resistance of the second resistor R2 and a capacitance of the second capacitor C2.

Figure 7:
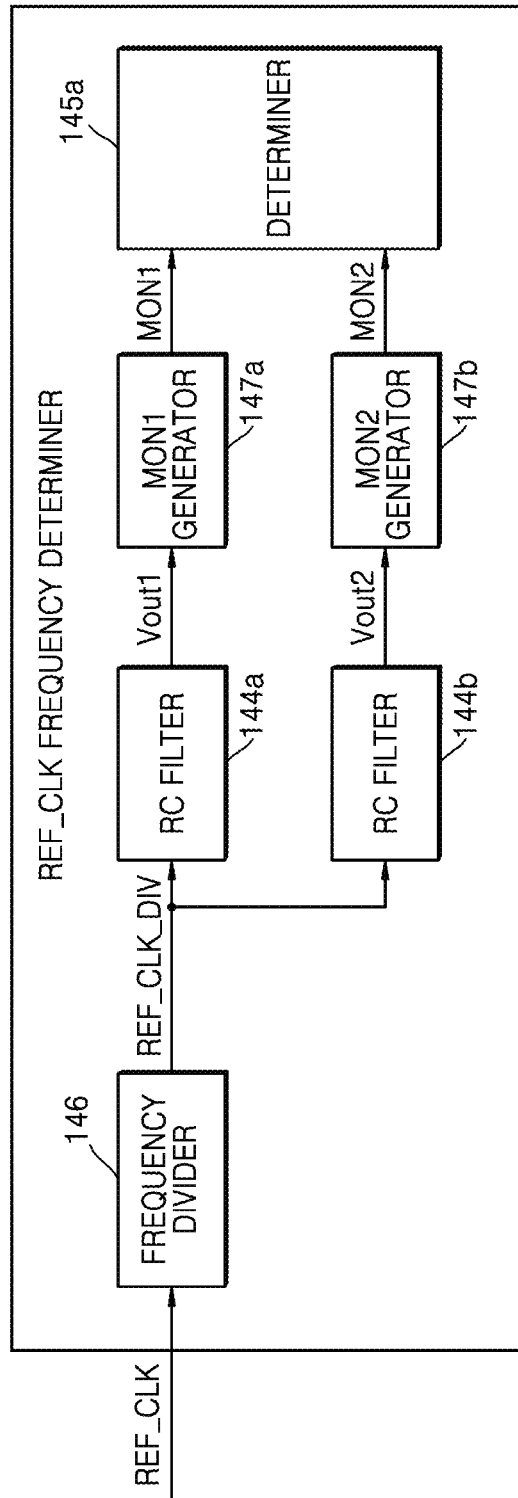
FIG. 7 is a block diagram of a reference clock frequency determiner according to some example embodiments.

FIG. 7 is a block diagram of a reference clock frequency determiner 140c according to some example embodiments.

Referring to FIG. 7, the reference clock frequency determiner 140c may include a frequency divider 146, the first RC filter 144a, the second RC filter 144b, a first monitor signal generator 147a, a second monitor signal generator 147b, and a determiner 145a. The reference clock frequency determiner 140c may correspond to a modification of the reference clock frequency determiner 140b of FIG. 6, and the description given above with reference to FIGS. 1 and 6 may also be applied to FIG. 7.

The frequency divider 146 may generate a frequency-divided reference clock signal REF_CLK_DIV from the reference clock signal REF_CLK based on a frequency division signal. For example, the frequency divider 146 may generate the frequency-divided reference clock signal REF_CLK_DIV by dividing the frequency of the reference clock signal REF_CLK by 2. When a reference clock frequency is determined based on the frequency-divided reference clock signal REF_CLK_DIV as described above, a frequency measurement error may be reduced.

The first RC filter 144a and the second RC filter 144b may respectively generate the first output voltage Vout1 and the second output voltage Vout2 from the frequency-divided reference clock signal REF_CLK_DIV at different time points. The first and second monitor signal generators 147a and 147b may respectively generate first and second monitor signals MON1 and MON2 respectively from the first and second output voltages Vout1 and Vout2. The determiner 145a may determine a frequency clock frequency from the first and second monitor signals MON1 and MON2.

FIG. 8 is a timing diagram illustrating a frequency determination operation of the reference clock frequency determiner 140c of FIG. 7, according to some example embodiments.

Referring to FIGS. 7 and 8, the reference clock signal REF_CLK and the frequency-divided reference clock signal REF_CLK_DIV may transit from a logic low level (e.g. a "0") to a logic high level (e.g. a "1") at a time point t0, and accordingly, the levels of the first and second output voltages Vout1 and Vout2 may increase. The first output voltage Vout1 corresponding to the reference clock signal REF_CLK may be detected at the time point t1, and the first monitor signal generator 147a may generate the first monitor signal MON1, which is enabled according to the level of the first output voltage Vout1. Because the frequency-divided reference clock signal REF_CLK_DIV is at the logic high level at the time point t1, the first output voltage Vout1 may be at a level that is higher than or equal to a reference voltage level. Accordingly, the first monitor signal MON1 may be enabled at a logic high level. In some example embodiments, the first RC filter 144a may include an internal switch. When the first monitor signal MON1 is enabled, the internal switch of the first RC filter 144a may be turned off. Accordingly, the frequency-divided reference clock signal REF_CLK_DIV may not be applied to the first RC filter 144a after the time point t1 so that the level of the first output voltage Vout1 may decrease.

At the time point t2, the frequency-divided reference clock signal REF_CLK_DIV may transit from the logic high level to the logic low level so that the level of the second output voltage Vout2 may decrease. The second output voltage Vout2 corresponding to the reference clock signal REF_CLK may be detected at a time point t3, and the second monitor signal generator 147b may generate the second monitor signal MON2, which is enabled according to the level of the second output voltage Vout2. Because the frequency-divided reference clock signal REF_CLK_DIV is at the logic low level at the time point t3, the second output voltage Vout2 may be at a level that is lower than the reference voltage level. Accordingly, the second monitor signal MON2 may not be enabled at a logic high level. The determiner 145a may determine, based on the first and second monitor signals MON1 and MON2, that the frequency-divided reference clock signal REF_CLK_DIV has transited to the logic low level in a period between the time points t1 and t3, and may thus determine the frequency of the reference clock signal REF_CLK.

Example embodiments described above may not be mutually exclusive. For example, some example embodiments may include some or all features of reference clock frequency counter 140a, some or all features of reference clock frequency determiner 140b, and/or some or all features of reference clock frequency determiner 140c.

Figure 9:
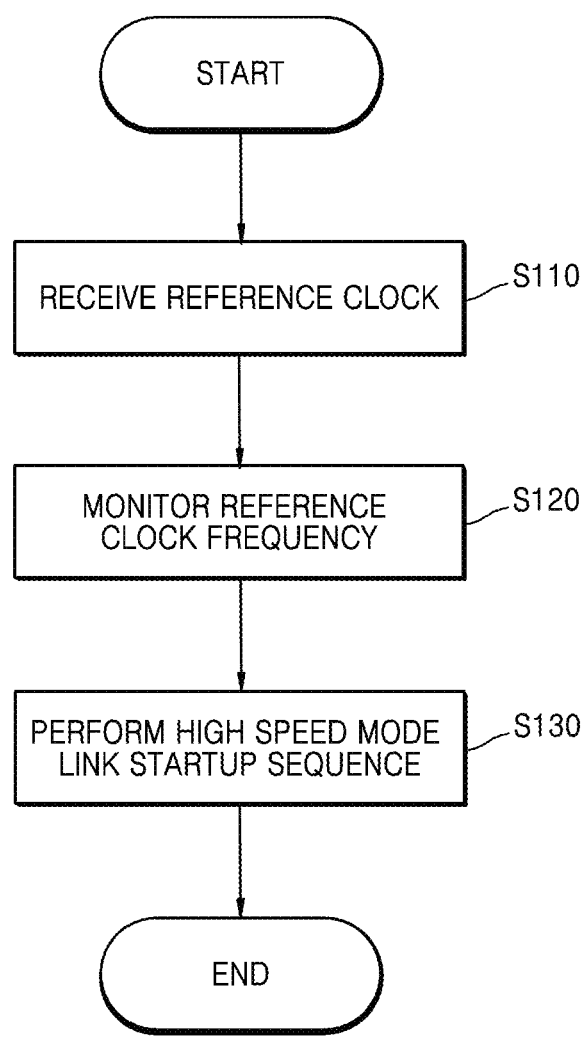
FIG. 9 is a flowchart of an operating method of a storage device, according to some example embodiments.

FIG. 9 is a flowchart of an operating method of a storage device, according to some example embodiments. Referring to FIG. 9, the operating method of a storage device may correspond to a link startup operation of the storage device and may include, for example, operations time-sequentially performed by the storage device 100 or 100A in FIG. 1 or 3. The description given above with reference to FIGS. 1 through 8 may also be applied to FIG. 9, and redundant description will be omitted.

The storage device 100 receives the reference clock signal REF_CLK in operation S110. For example, the storage device 100 may receive the reference clock signal REF_CLK from the host 200 through the first pin P1. For example, when power is supplied to the storage system 10, the storage device 100 may receive the reference clock signal REF_CLK from the host 200.

The storage device 100 monitors a reference clock frequency with respect to the reference clock signal REF_CLK in operation S120. For example, the reference clock frequency counter 140*a* may monitor the reference clock frequency by comparing the reference clock signal REF_CLK with the system clock signal SYS_CLK. For example, the reference clock frequency determiner 140*b* or 140*c* may monitor the reference clock frequency based on first and second output voltages, which correspond to the reference clock signal REF_CLK at different time points, respectively.

The storage device 100 performs a high speed mode link startup sequence in operation S130. In some example embodiments, the high speed mode link startup sequence may include performing a first trigger event in which physical lane numbers of a transmitting lane and a receiving lane are exchanged between the storage device 100 and the host 200, a second trigger event in which an item of transmitting lane information and an item of receiving lane information are exchanged between the storage device 100 and the host 200, and a third trigger event in which items of logical lane information of the transmitting lane and the receiving lane are exchanged between the storage device 100 and the host 200. In some example embodiments, the high speed mode link startup sequence may further include, after the third trigger event, an event of allowing items of capability information to be exchanged and recognized by the storage device 100 and the host 200 and an event of allowing control frames to be exchanged and recognized by the storage device 100 and the host 200, wherein the control frames indicate that an initial data frame has been correctly received.

Figure 10:
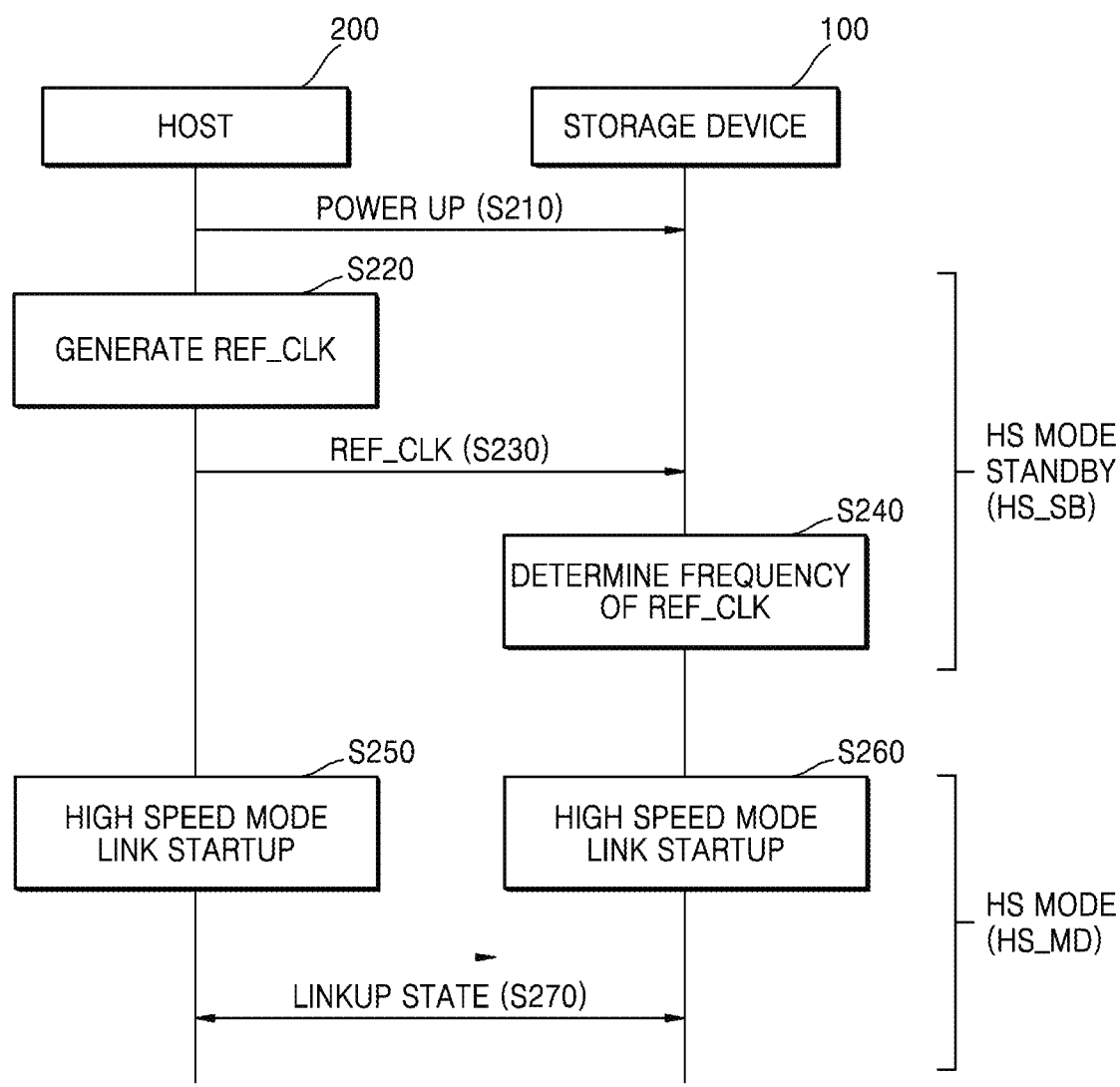
FIG. 10 is a flowchart of operations between a host and a storage device, according to some example embodiments.

FIG. 10 is a flowchart of operations between the host 200 and the storage device 100, according to some example embodiments.

Referring to FIG. 10, the storage system 10 may be powered up and thus may transmit the power to the host 200 and the storage device 100 in operation S210. The host 200 generates the reference clock signal REF_CLK in operation S220. The host 200 transmits the reference clock signal REF_CLK to the storage device 100 in operation S230. The storage device 100 determines a frequency of the reference clock signal REF_CLK received from the host 200 in operation S240. Operations S220 through S240 may be referred to as a high speed mode standby HS_SB.

The host 200 performs a high speed mode link startup in operation S250. The storage device 100 performs the high speed mode link startup in operation S260. Operations S250 and S260 may be performed substantially at the same time. For example, operations S250 and S260 may correspond to operation S130 in FIG. 9. In some example embodiments, a link startup may include initialization of the PLs 111 and 211 and the LLs 115 and 215. The link startup may further include information exchange between the host 200 and the storage device 100. When the link startup is completed, the host 200 and the storage device 100 may be set to a linkup state in operation S270, and may reliably exchange data with each other. Operations S250 through S270 may be performed in a high speed mode HS_MD.

Figure 11:
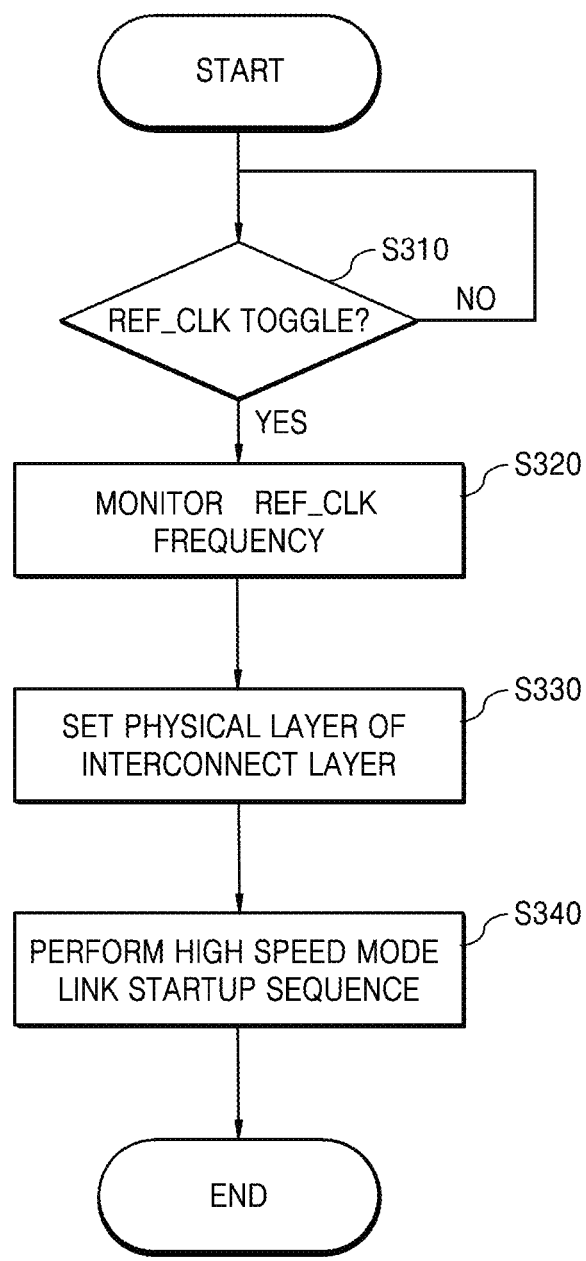
FIG. 11 is a flowchart of an operating method of a storage device, according to some example embodiments.

FIG. 11 is a flowchart of an operating method of a storage device, according to some example embodiments. Referring to FIG. 11, the operating method of a storage device may correspond to a link startup method of a storage device and may correspond to a modification of the operating method of FIG. 9. For example, the operating method of FIG. 11 may be performed by the storage device 100 in FIG. 1 and is described with reference to FIGS. 1 and 11 below.

The storage device 100 determines whether the reference clock signal REF_CLK toggles in operation S310. In some example embodiments, operation S310 may be performed when power is supplied to the storage device 100, for example, from the host 200. In some example embodiments, operation S310 may be periodically performed during the operation of the storage device 100. In some example embodiments, operation S310 may be performed when the storage device 100 receives a particular signal from the host 200 while operating.

The storage device 100 may determine whether the reference clock signal REF_CLK toggles by detecting the first pin P1 receiving the reference clock signal REF_CLK from the host 200. In detail, the storage device 100 may determine existence or non-existence of the reference clock signal REF_CLK, or reception or non-reception of the reference clock signal REF_CLK by detecting the first pin P1. When a signal containing repeated logic high and logic low cycles is detected in the first pin P1, then the storage device 100 may determine the reference clock signal REF_CLK has toggled, and accordingly, the storage device 100 may determine that the reference clock signal REF_CLK has been received and perform operation S320. When a signal substantially at a flat level, e.g. at an untoggling level, is detected in the first pin P1, the storage device 100 may determine the reference clock signal REF_CLK does not toggle, and accordingly, the storage device 100 may determine that the reference clock signal REF_CLK is not received.

The storage device 100 may monitor a frequency of the reference clock signal REF_CLK in operation S320. For example, the reference clock frequency determiner 140 may determine the frequency of the reference clock signal REF_CLK. The storage device 100 sets a physical layer of an interconnect layer according to the frequency of the reference clock signal REF_CLK in operation S330. For example, the device controller 120 may set the PL 111 of the interconnect unit 110 according to the frequency of the reference clock signal REF_CLK. For example, the device controller 120 may transmit information about the frequency of the reference clock signal REF_CLK to the LL 115 of the interconnect unit 110. For example, the storage device 100 may initialize the PL 111 and the LL 115 according to the frequency of the reference clock signal REF_CLK.

The storage device 100 performs a high speed mode link startup sequence in operation S340. For example, operation S340 may correspond to operation S130 in FIG. 9. In detail, the host 200 and the storage device 100 may exchange information with each other in a high speed mode. Therefore, a time taken for a link startup between the host 200 and the storage device 100 may be reduced, and the host 200 and the storage device 100 may be set to a linkup state and thus exchange data with each other.

Figure 12:
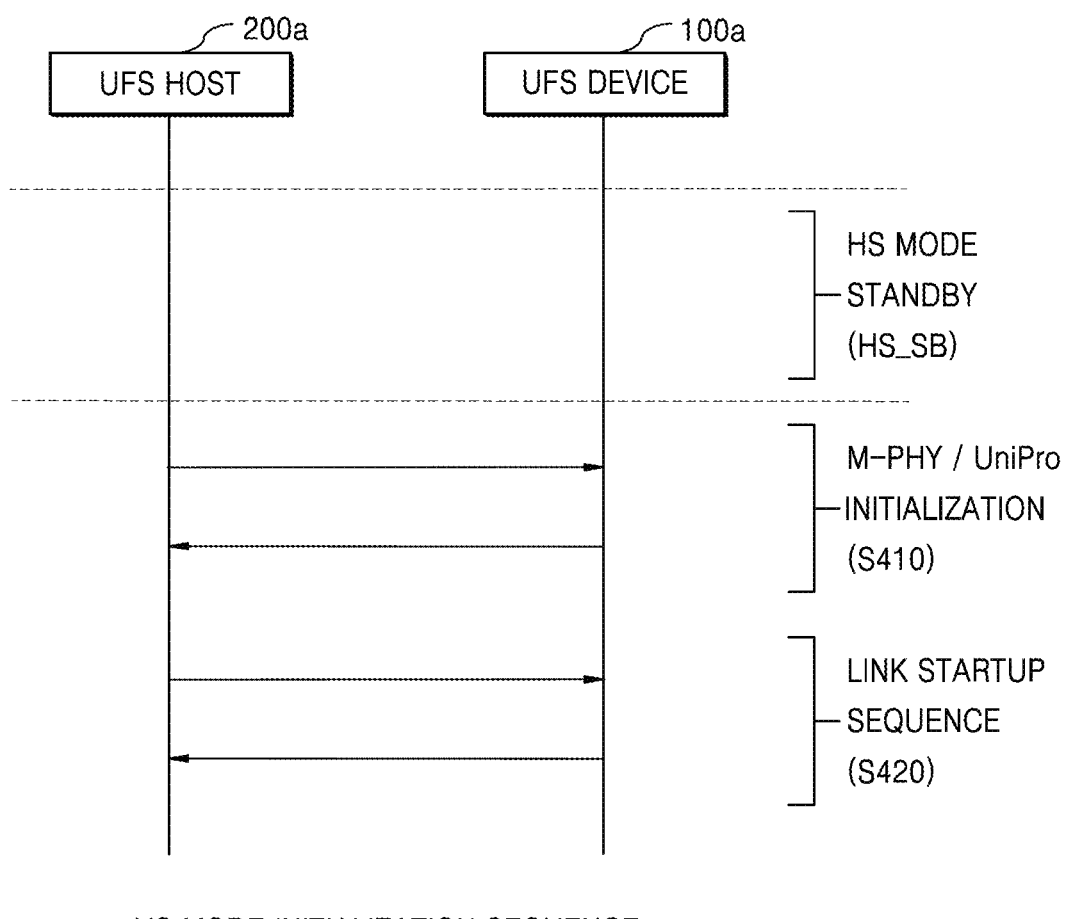
FIG. 12 is a flowchart of an example of a high speed mode initialization sequence between a universal flash storage (UFS) host and a UFS device, according to some example embodiments.

FIG. 12 is a flowchart of an example of a high speed mode initialization sequence between a UFS host 200*a* and a UFS device 100*a*, according to some example embodiments.

Referring to FIG. 12, the UFS host 200*a* may be an example of the host 200 in FIG. 1, and the UFS device 100*a* may be an example of the storage device 100 in FIG. 1. When power is supplied to the UFS host 200*a* and the UFS device 100*a*, the UFS device 100*a* may receive the reference clock signal REF_CLK from the UFS host 200*a* and determine a frequency of the reference clock signal REF_CLK in the high speed mode standby HS_SB. When the frequency of the reference clock signal REF_CLK is determined, the UFS host 200*a* and the UFS device 100*a* may perform a link startup in a high speed mode. In detail, the UFS host 200*a* and the UFS device 100*a* may perform M-PHY/UniPro initialization in operation S410 and may perform a link startup sequence by exchanging information in operation S420. At this time, the UFS host 200*a* and the UFS device 100*a* may simultaneously perform read and write operations in parallel through a full-duplex low-voltage differential signaling (LVDS) serial interface.

Figure 13:
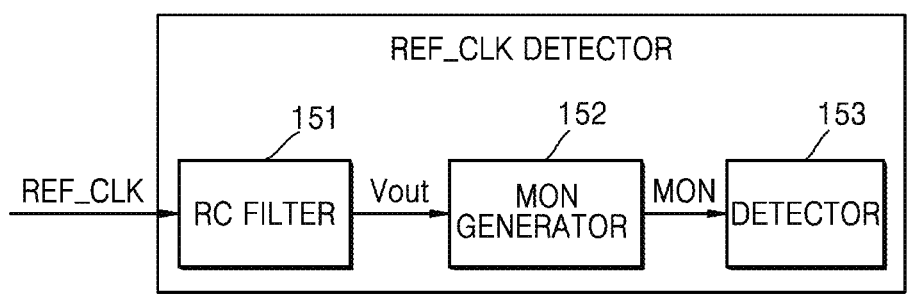
FIG. 13 is a block diagram of a reference clock detector according to some example embodiments.

FIG. 13 is a block diagram of a reference clock detector 150 according to some example embodiments.

Referring to FIG. 13, the reference clock detector 150 may include an RC filter 151, a monitor signal generator 152, and a detector 153. For example, the storage device 100 or 100A in FIG. 1 or 3 may further include the reference clock detector 150. In some example embodiments, the reference clock detector 150 may be included in the device controller 120. However, embodiments are not limited thereto.

The RC filter 151 may generate an output voltage Vout from the reference clock signal REF_CLK. For example, the RC filter 151 may be substantially similar to the first or second RC filter 144*a* or 144*b* described above and may detect the output voltage Vout corresponding to the reference clock signal REF_CLK at a certain time point. The monitor signal generator 152 may generate a monitor signal MON, which is enabled according to the output voltage Vout. The detector 153 may detect reception or non-reception of the reference clock signal REF_CLK according to the monitor signal MON.

Figure 14:
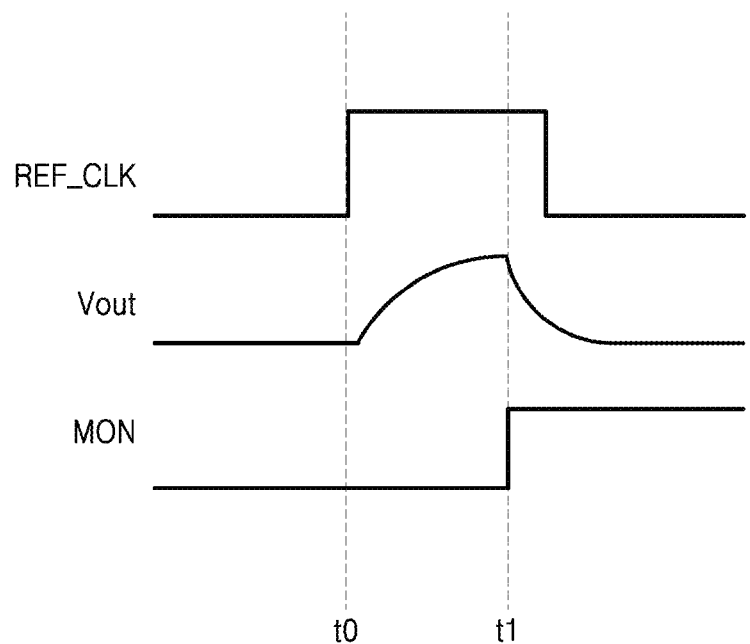
FIG. 14 is a timing diagram illustrating a reference clock detection operation of the reference clock detector of FIG. 13, according to some example embodiments.

FIG. 14 is a timing diagram illustrating a reference clock detection operation of the reference clock detector 150 of FIG. 13, according to some example embodiments.

Referring to FIGS. 13 and 14, the reference clock signal REF_CLK may transit from the logic low level to the logic high level at the time point t0, and accordingly, the level of the output voltage Vout may increase. The output voltage Vout corresponding to the reference clock signal REF_CLK may be detected at the time point t1, and the monitor signal generator 152 may generate the monitor signal MON, which is enabled according to the level of the output voltage Vout. Because the reference clock signal REF_CLK is at the logic high level at the time point t1, the output voltage Vout may be at a level that is greater than or equal to a reference voltage level. Accordingly, the monitor signal MON may be enabled at a logic high level.

In some example embodiments, the RC filter 151 may include an internal switch. When the monitor signal MON is enabled, the internal switch of the RC filter 151 may be turned off. Accordingly, the reference clock signal REF_CLK may not be applied to the RC filter 151 after the time point t1 so that the level of the output voltage Vout may decrease. The detector 153 may determine, based on the monitor signal MON, that the reference clock signal REF_CLK is at the logic high level at the time point t1 and may thus detect reception of the reference clock signal REF_CLK, i.e., toggling of the reference clock signal REF_CLK.

Figure 15:
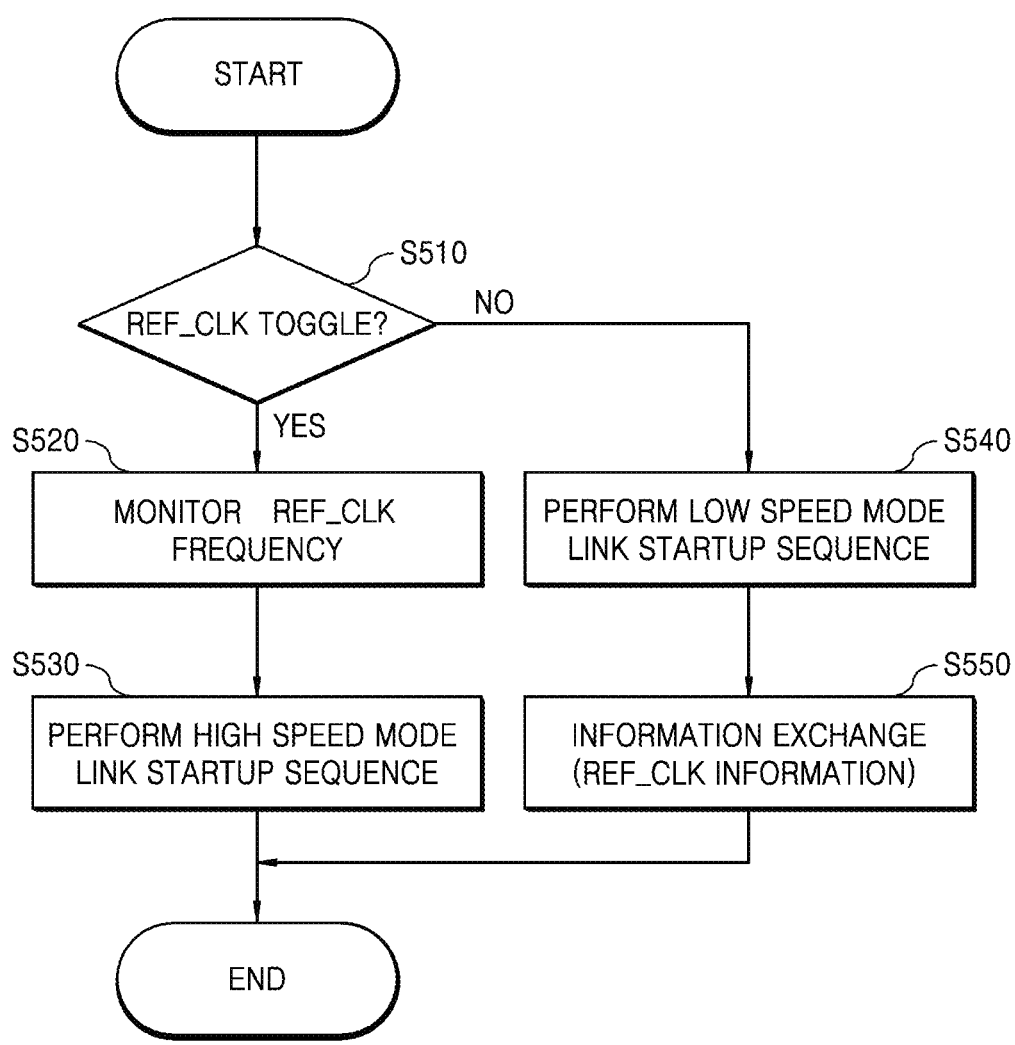
FIGS. 15 through 17 are flowcharts of operating methods of a storage device, according to some embodiments.

FIG. 15 is a flowchart of an operating method of a storage device, according to some example embodiments.

Referring to FIG. 15, the storage device 100 determines whether the reference clock signal REF_CLK toggles in operation S510. For example, the reference clock detector 150 of FIG. 13 may determine whether the reference clock signal REF_CLK toggles. When the storage device 100 determines that the reference clock signal REF_CLK toggles, the storage device 100 monitors a frequency of the reference clock signal REF_CLK in operation S520. The storage device 100 performs a high speed mode link startup sequence in operation S530. For example, operation S530 may correspond to operation S130 in FIG. 9.

Otherwise, when the storage device determines that the reference clock signal REF_CLK does not toggle, the storage device 100 performs a low speed mode link startup sequence in operation S540. For example, a low speed mode may correspond to a pulse width modulation (PWM) mode. The storage device 100 may exchange information with the host 200 in the low speed mode, i.e., the PWM mode, in operation S550. For example, the storage device 100 may receive frequency information of the reference clock signal REF_CLK from the host 200 in the PWM mode.

In a low speed mode link startup performed in the PWM mode, when information necessary/used for a link startup is exchanged between the storage device 100 and the host 200 through a lane (e.g., a transmitting lane or a receiving lane), bits representing the information necessary/used for the link startup are expressed by the pulse width of a signal transmitted through the lane. A return-to-zero (RZ), in which a logic low period is positively necessary/used between logic high periods of a signal transmitted through a lane, is applied to this low speed mode link startup in the PWM mode.

Alternatively, in a high speed mode link startup, bits representing information necessary/used for a link startup are expressed by logic levels of a signal transmitted through a lane, and a non-return-to-zero (NRZ), in which a logic low period is not necessary/used between consecutive logic high periods, is used. Accordingly, a high speed mode link startup operation may be performed at a higher speed than a low speed mode link startup operation.

Figure 16:
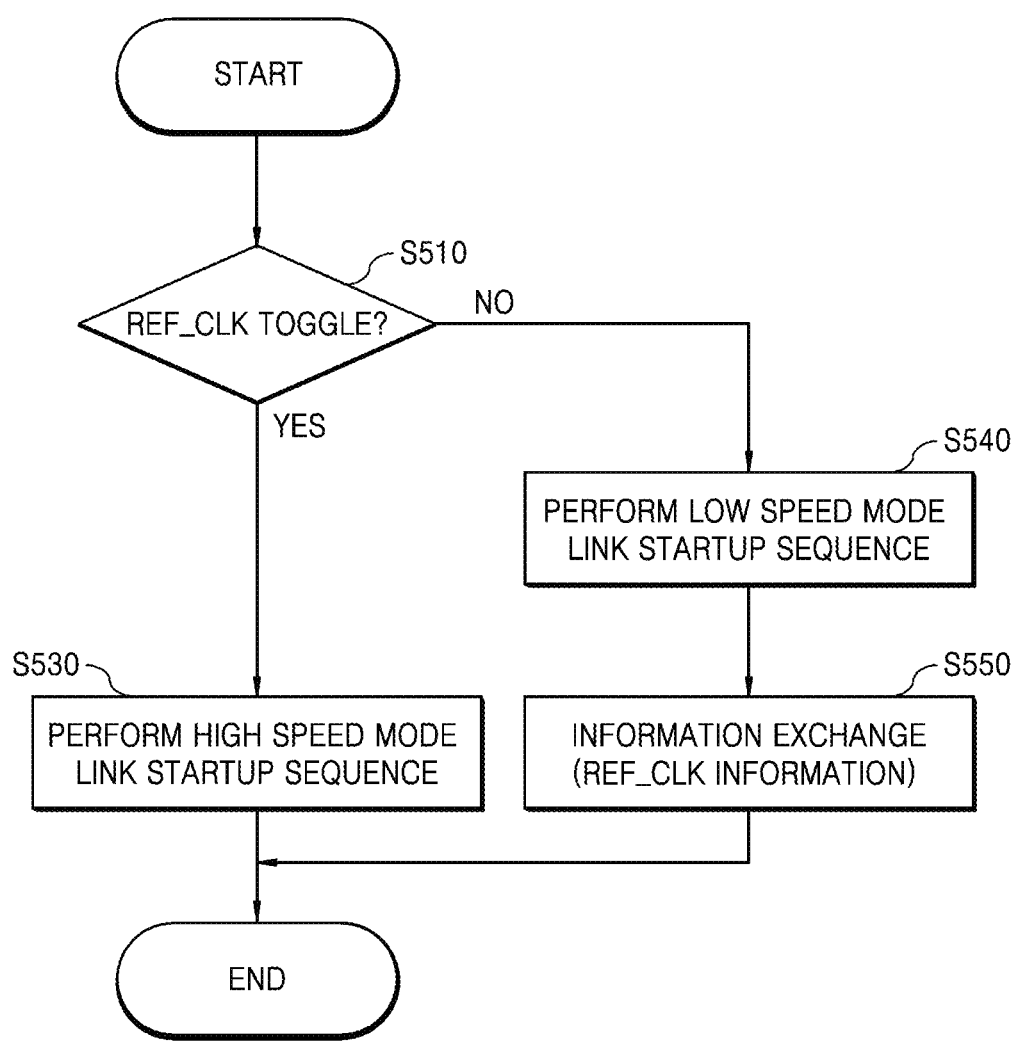

FIG. 16 is a flowchart of an operating method of a storage device, according to some example embodiments.

Referring to FIG. 16, the operating method of some example embodiments corresponds to a modification of the operating method of FIG. 15. The storage device 100 determines whether the reference clock signal REF_CLK toggles in operation S510. When the storage device 100 determines that the reference clock signal REF_CLK toggles, the storage device 100 may perform the high speed mode link startup sequence in operation S530. As described above, according to some example embodiments, when toggling of the reference clock signal REF_CLK is detected, the storage device 100 may perform the high speed mode link startup sequence without determining the frequency of the reference clock signal REF_CLK. Therefore, the time taken for the link startup may be further reduced, and the capability of the storage device 100 may be further increased.

Figure 17:
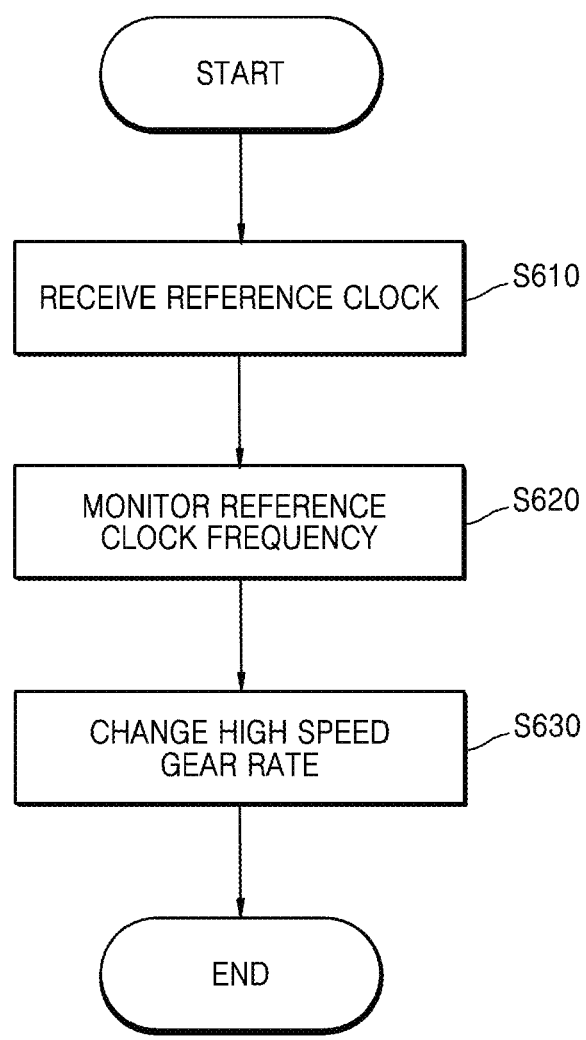

FIG. 17 is a flowchart of an operating method of a storage device, according to some example embodiments. Referring to FIG. 17, the operating method of some example embodiments may correspond to a method of changing a speed gear during the operation of a storage device. For example, the operating method of some example embodiments may include operations time sequentially performed by the storage device 100 in FIG. 1. The description given above with reference to FIGS. 1 through 16 may also be applied to FIG. 17, and redundant description will be omitted. Descriptions will be made with reference to FIGS. 1 and 17 below.

The storage device 100 receives the reference clock signal REF_CLK in operation S610. For example, the storage device 100 may receive the reference clock signal REF_CLK from the host 200 through the first pin P1 in a linkup state. For example, the storage device 100 may continuously receive the reference clock signal REF_CLK from the host 200 while exchanging data with the host 200. For example, the storage device 100 may receive the reference clock signal REF_CLK having a changed frequency from the host while exchanging data with the host 200.

The storage device 100 monitors a reference clock frequency with respect to the reference clock signal REF_CLK in operation S620. For example, the reference clock frequency determiner 140 may detect that the frequency of the reference clock signal REF_CLK changes from a first reference clock frequency to a second reference clock frequency. For example, the reference clock frequency determiner 140 may periodically monitor the reference clock frequency. For example, the reference clock frequency determiner 140 may monitor the reference clock frequency when receiving an enable signal.

The storage device 100 changes a high speed gear according to the reference clock frequency in operation S630. For example, when the frequency of the reference clock signal REF_CLK changes from the first reference clock frequency to the second reference clock frequency, the storage device 100 may reset the PL 111 of the interconnect unit 110 according to the second reference clock frequency. For example, when the frequency of the reference clock signal REF_CLK changes from the first reference clock frequency to the second reference clock frequency, the storage device 100 may transmit information about the second reference clock frequency to the LL 115 of the interconnect unit 110.

Figure 18:
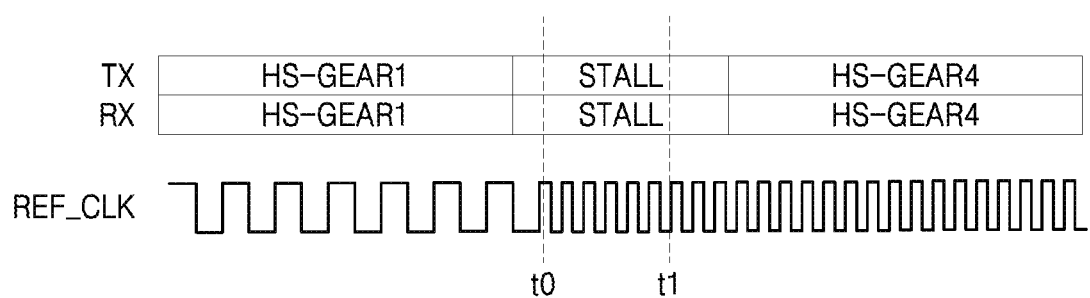
FIG. 18 is a diagram of an example of a reference clock frequency updating operation of a reference clock frequency determiner, according to some example embodiments.

FIG. 18 is a diagram of an example of a reference clock frequency updating operation of the reference clock frequency determiner 140, according to some example embodiments.

Referring to FIGS. 1 and 18, the host 200 may change the frequency of the reference clock signal REF_CLK during operation for the improvements/optimization of power and input/output performance. The host 200 and the storage device 100 may support various speed gears and various power saving states such as a stall state for a high speed mode and a sleep state for a low speed mode. According to some example embodiments, when a speed gear between the host 200 and the storage device 100 is changed, the host 200 may generate the reference clock signal REF_CLK having a changed frequency. In a power saving state, the storage device 100 may determine the changed frequency of the reference clock signal REF_CLK received from the host 200 and may operate according to the changed frequency.

For example, the host 200 may change the speed gear, e.g., a high speed gear, between the host 200 and the storage device 100 from HS-GEAR1 to HS-GEAR4 to increase input/output performance. For this change in the speed gear, the host 200 may increase the frequency of the reference clock signal REF_CLK. At this time, in a stall period STALL between the high speed gears HS-GEAR1 and HS-GEAR4, the storage device 100 may determine the changed frequency of the reference clock signal REF_CLK and may support the high speed gear HS-GEAR4 by using the changed frequency when communicating with the host 200. For example, the reference clock frequency determiner 140 may determine the changed frequency of the reference clock signal REF_CLK during a frequency determination period between the time point t0 and the time point t1. For example, a transmitter TX and a receiver RX may be included in the PL 211 of the host 200 or the PL 111 of the storage device 100.

Figure 19:
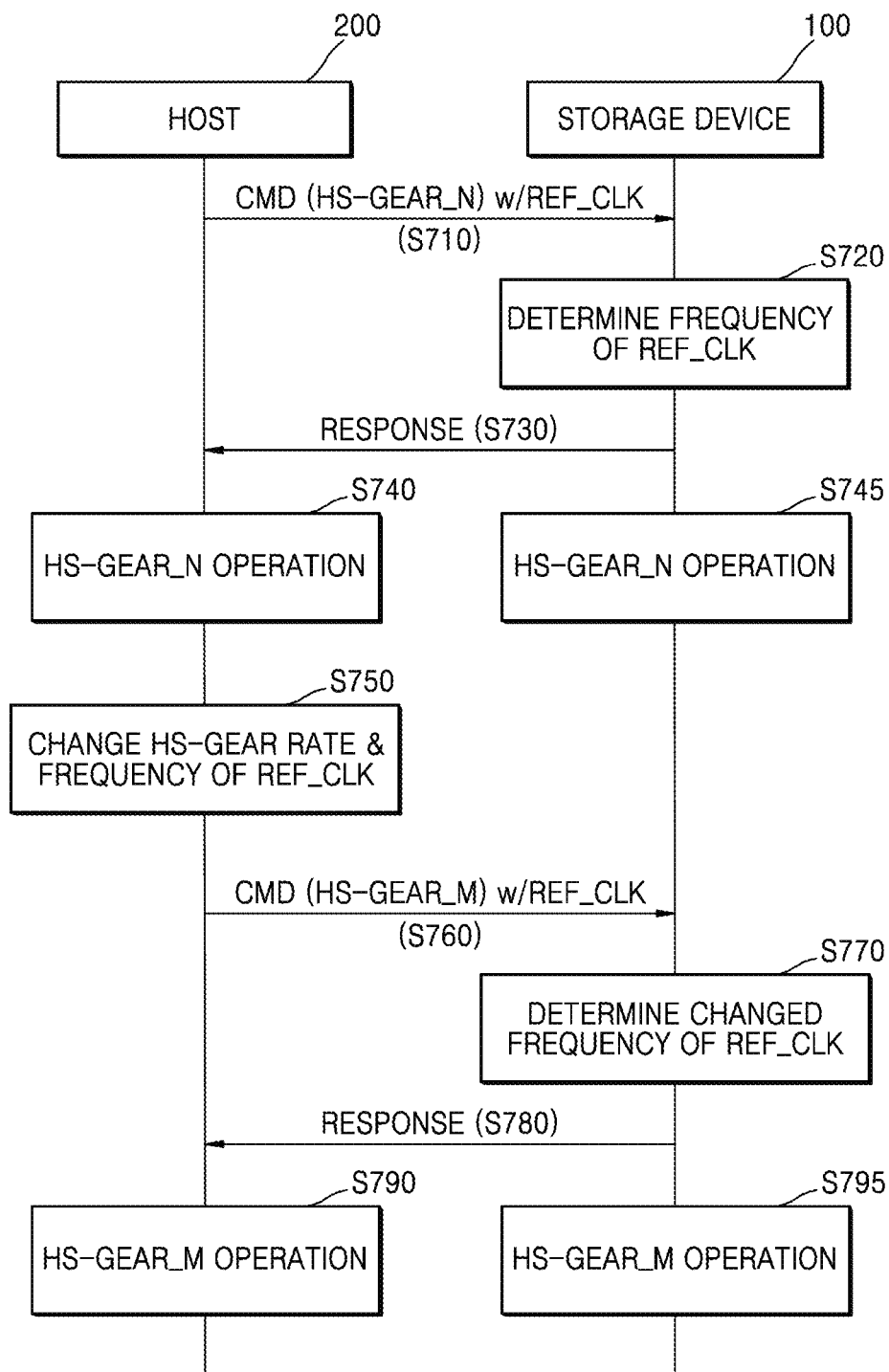
FIG. 19 is a flowchart of operations between a host and a storage device, according to some example embodiments.

FIG. 19 is a flowchart of operations between the host 200 and the storage device 100, according to some example embodiments.

Referring to FIGS. 18 and 19, the host 200 may transmit a command CMD indicating a first speed gear (e.g., HS-GEAR_N) to the storage device 100 in operation S710. Here, N may be a positive integer, e.g., one or more than one. At this time, the host 200 may transmit the reference clock signal REF_CLK, which toggles at a first frequency according to the first speed gear HS-GEAR_N, to the storage device 100. In some example embodiments, the host 200 may transmit the command CMD and the reference clock signal REF_CLK in parallel, i.e., substantially simultaneously, to the storage device 100. However, example embodiments are not limited thereto. In some example embodiments, the host 200 may transmit the command CMD first and then transmit the reference clock signal REF_CLK toggling at the first frequency. In some example embodiments, a transmission start time of the reference clock signal REF_CLK, which toggles at the first frequency, may be earlier than a transmission start point of the command CMD.

The storage device 100 determines a frequency of the reference clock signal REF_CLK received from the host 200 in operation S720. The storage device 100 transmits a response to the host 200 in operation S730. The host 200 operates at the first speed gear HS-GEAR_N in operation S740. The storage device 100 operates at the first speed gear HS-GEAR_N in operation S745. Operations S740 and S745 may be performed substantially simultaneously. For example, the host 200 and the storage device 100 may exchange data at the high speed gear HS-GEAR1.

The host 200 changes the speed gear and the frequency of the reference clock signal REF_CLK in operation S750. In detail, the host 200 may change the speed gear from the first speed gear HS-GEAR_N to a second speed gear HS-GEAR_M, where M may be a positive integer. For example, M may be four, or less than four, or greater than four. The host 200 may transmit the command CMD indicating the second speed gear HS-GEAR_M to the storage device 100 in operation S760. At this time, the host 200 may transmit the reference clock signal REF_CLK, which toggles at a second frequency according to the second speed gear HS-GEAR_M, to the storage device 100. In some example embodiments, the host 200 may transmit the command CMD and the reference clock signal REF_CLK in parallel, i.e., substantially simultaneously, to the storage device 100. However, example embodiments are not limited thereto. In some example embodiments, the host 200 may transmit the command CMD first and then transmit the reference clock signal REF_CLK toggling at the second frequency. In some example embodiments, a transmission start time of the reference clock signal REF_CLK, which toggles at the second frequency, may be earlier than a transmission start point of the command CMD. Here, the transmission start time of the reference clock signal REF_CLK, which toggles at the second frequency, may correspond to a time when the frequency of the reference clock signal REF_CLK changes from the first frequency to the second frequency.

The storage device 100 determines the changed frequency of the reference clock signal REF_CLK received from the host 200 in operation S770. The storage device 100 transmits a response to the host 200 in operation S780. For example, operations S750 through S780 may correspond to the stall period STALL in FIG. 18. The host 200 operates at the second speed gear HS-GEAR_M in operation S790. The storage device 100 operates at the second speed gear HS-GEAR_M in operation S795. Operations S790 and S795 may be performed substantially simultaneously. For example, the host 200 and the storage device 100 may exchange data at the high speed gear HS-GEAR4.

Figure 20:
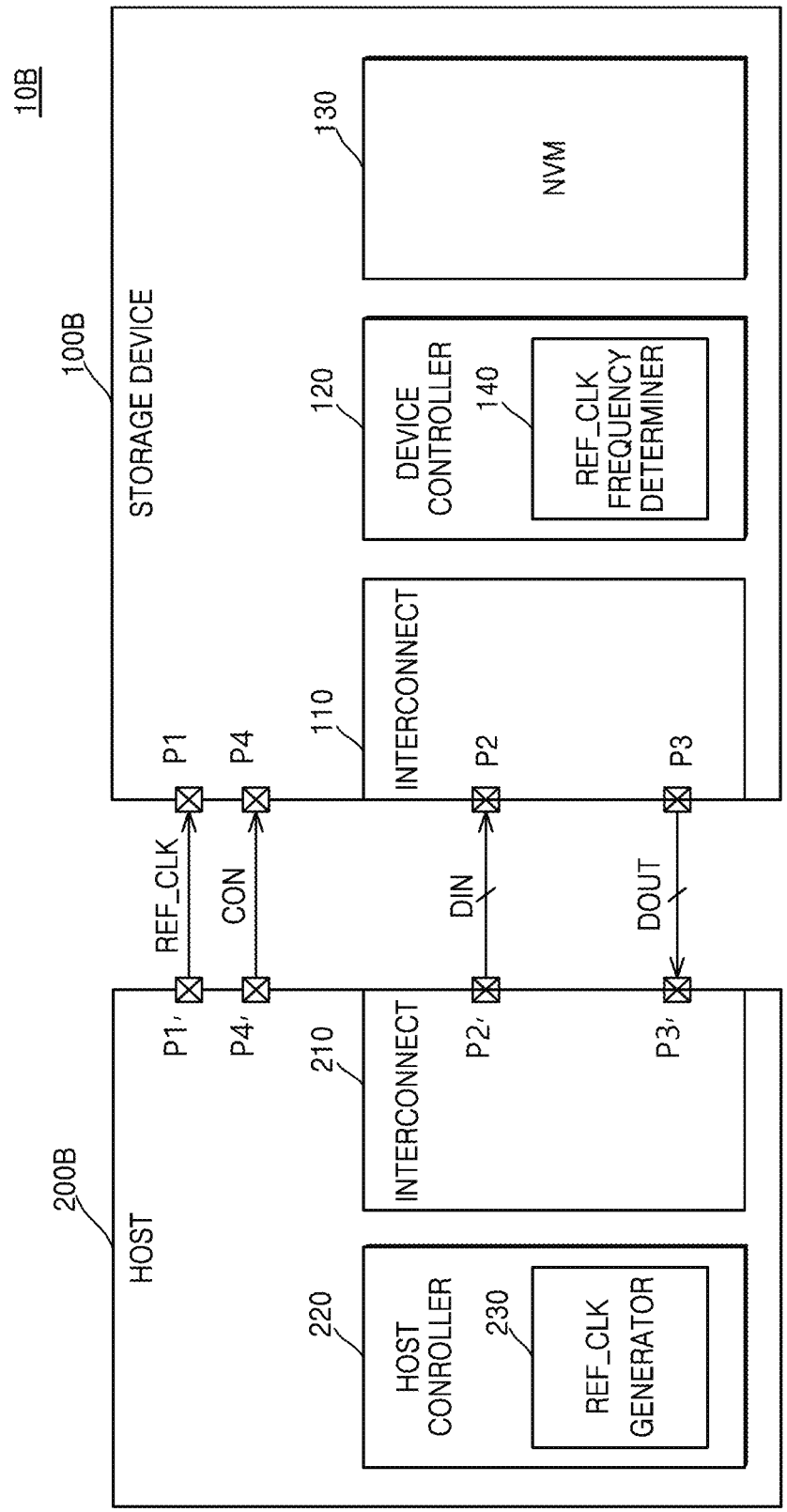
FIG. 20 is a block diagram of a storage system according to some example embodiments.

FIG. 20 is a block diagram of a storage system 10B according to some example embodiments.

Referring to FIG. 20, the storage system 10B may include a storage device 100B and a host 200B. The storage system 10B corresponds to a modification of the storage system 10 of FIG. 1, and the description given above with reference to FIGS. 1 through 19 may also be applied FIG. 20. Compared to the storage device 100 in FIG. 1, the storage device 100B may further include a fourth pin P4. Compared to the host 200 in FIG. 1, the host 200B may further include a fourth pin P4'. The host 200B may provide a control signal CON to the storage device 100B through the fourth pins P4' and P4. The storage device 100B may operate based on the control signal CON received from the host 200B. This mode may be referred to as a pin-strap mode. Various example embodiments of the control signal CON are described with reference to FIGS. 21 through 23 below.

FIG. 21 is a table TB1 showing the control signal CON, according to some example embodiments.

Referring to FIGS. 20 and 21, the control signal CON may include a reference clock frequency signal REF_CLK_FRQ indicating a frequency value of the reference clock signal REF_CLK. Hereinafter, the fourth pins P4' and P4 may be referred to as reference clock frequency pins P4' and P4. In detail, the host 200B may include at least one reference clock frequency pin P4' to transmit, e.g. directly transmit the frequency value of the reference clock signal REF_CLK to the storage device 100B, and the storage device 100B may include at least one reference clock frequency pin P4 to directly receive the frequency value of the reference clock signal REF_CLK. According to some example embodiments, the number of reference clock frequency pins P4' and the number of reference clock frequency pins P4 may vary with the number of selectable frequencies of the reference clock signal REF_CLK.

For example, when the frequency of the reference clock signal REF_CLK is set to 19.2 MHz, 26 MHz, 38.4 MHz, or 52 MHz, the host 200B may include two reference clock frequency pins P4' and the storage device 100B may include two reference clock frequency pins P4. The host 200B may transmit a 2-bit signal, i.e., the reference clock frequency signal REF_CLK_FRQ, indicating the frequency value of the reference clock signal REF_CLK to the storage device 100B through the two reference clock frequency pins P4'. The storage device 100B may receive a 2-bit signal, i.e., the reference clock frequency signal REF_CLK_FRQ, indicating the frequency value of the reference clock signal REF_CLK from the host 200B through the two reference clock frequency pins P4.

For example, when the host 200B transmits the reference clock frequency signal REF_CLK_FRQ of "00" through the two reference clock frequency pins P4', the storage device 100B may determine the frequency of the reference clock signal REF_CLK to be 19.2 MHz. For example, when the host 200B transmits the reference clock frequency signal REF_CLK_FRQ of "01" through the two reference clock frequency pins P4', the storage device 100B may determine the frequency of the reference clock signal REF_CLK to be 26 MHz. For example, when the host 200B transmits the reference clock frequency signal REF_CLK_FRQ of "10" through the two reference clock frequency pins P4', the storage device 100B may determine the frequency of the reference clock signal REF_CLK to be 38.4 MHz. For example, when the host 200B transmits the reference clock frequency signal REF_CLK_FRQ of "11" through the two reference clock frequency pins P4', the storage device 100B may determine the frequency of the reference clock signal REF_CLK to be 52 MHz. Example embodiments are not limited thereto; for example, one of ordinary skill in the art may recognize other potential mappings between the frequency value and the reference clock frequency signal REF_CLK_FRQ.

When the host 200B changes the frequency of the reference clock signal REF_CLK while the storage device 100 is operating, the host 200B may transmit changed frequency information of the reference clock signal REF_CLK to the storage device 100B through the reference clock frequency pins P4'. The storage device 100B may receive the changed frequency information of the reference clock signal REF_CLK through the reference clock frequency pins P4 and exchange data with the host 200B based on the changed frequency information.

FIG. 22 is a table TB2 showing the control signal CON, according to some example embodiments.

Referring to FIGS. 20 and 22, the control signal CON may include a mode signal MD indicating an operation mode. Hereinafter, the fourth pins P4' and P4 may be referred to as mode pins P4' and P4. In detail, the host 200B may include at least one mode pin P4' to directly transmit the operation mode to the storage device 100B, and the storage device 100B may include at least one mode pin P4 to directly receive the operation mode from the host 200B. According to some example embodiments, the number of mode pins P4' and the number of mode pins P4 may vary with the number of selectable operation modes.

For example, when the operation mode is set to a low speed mode (e.g., a PWM mode) or a high speed mode, the host 200B may include one mode pin P4' and the storage device 100B may include one mode pin P4. The host 200B may transmit a 1-bit signal, i.e., the mode signal MD, indicating the operation mode to the storage device 100B through the one mode pin P4'. The storage device 100B may receive a 1-bit signal, i.e., the mode signal MD, indicating the operation mode from the host 200B through the one mode pin P4.

For example, when the host 200B transmits the mode signal MD of "0" through the one mode pin P4', the storage device 100B may determine the operation mode to be the low speed mode. For example, when the host 200B transmits the mode signal MD of "1" through the one mode pin P4', the storage device 100B may determine the operation mode to be the high speed mode. Accordingly, the storage device 100B may perform a high speed mode link startup operation or a low speed mode link startup operation according to the determined operation mode. For example, when the storage device 100B receives the mode signal MD indicating the high speed mode, the storage device 100B may perform operation S530 in FIG. 15. When the mode signal MD indicates the low speed mode, the storage device 100B may perform operation S540 in FIG. 15.

When the host 200B changes the operation mode while the storage device 100B is operating, the host 200B may transmit the mode signal MD indicating changed operation mode information to the storage device 100B through the mode pin P4'. The storage device 100B may receive the mode signal MD through the mode pin P4 and exchange data with the host 200B based on the changed operation mode. Example embodiments are not limited thereto; for example, one of ordinary skill in the art may recognize other potential mappings between the operation mode and the mode signal MD.

FIG. 23 is a table TB3 showing the control signal CON, according to some example embodiments.

Referring to FIGS. 20 and 23, the control signal CON may include a gear signal GS indicating a speed gear. Hereinafter, the fourth pins P4' and P4 may be referred to as gear pins P4' and P4. In detail, the host 200B may include at least one gear pin P4' to transmit, e.g. directly transmit speed gear information to the storage device 100B, and the storage device 100B may include at least one gear pin P4 to directly receive the speed gear information from the host 200B. According to some example embodiments, the number of gear pins P4' and the number of gear pins P4 may vary with the number of selectable speed gears.

For example, when the speed gear is set to one of various high speed gears (e.g., HS-GEAR1 through HS-GEAR4) and various PWM speed gears (e.g., PWM-G1), the host 200B may include three gear pins P4' and the storage device 100B may include three gear pins P4. The host 200B may transmit a 3-bit signal, i.e., the gear signal GS, indicating the speed gear to the storage device 100B through the three gear pins P4'. The storage device 100B may receive a 3-bit signal, i.e., the gear signal GS, indicating the speed gear from the host 200B through the three gear pins P4. Accordingly, the storage device 100B may quickly detect and apply a speed change in the high speed mode.

For example, when the host 200B transmits the gear signal GS of "000" through the three gear pins P4', the storage device 100B may determine the speed gear to be HS-GEAR1. For example, when the host 200B transmits the gear signal GS of "001" through the three gear pins P4', the storage device 100B may determine the speed gear to be HS-GEAR2. For example, when the host 200B transmits the gear signal GS of "010" through the three gear pins P4', the storage device 100B may determine the speed gear to be HS-GEAR3. For example, when the host 200B transmits the gear signal GS of "011" through the three gear pins P4', the storage device 100B may determine the speed gear to be HS-GEAR4. For example, when the host 200B transmits the gear signal GS of "100" through the three gear pins P4', the storage device 100B may determine the speed gear to be PWM-G1. Accordingly, the storage device 100B may exchange data with the host 200B according to the determined speed gear. For example, when the storage device 100B receives the gear signal GS indicating HS-GEAR1, the storage device 100B may perform operation S745 in FIG. 19. When the storage device 100B receives the gear signal GS indicating HS-GEAR4, the storage device 100B may perform operation S795 in FIG. 19.

When the host 200B changes the speed gear while the storage device 100B is operating, the host 200B may transmit the gear signal GS indicating changed speed gear information to the storage device 100B through the gear pins P4'. The storage device 100B may receive the gear signal GS through the gear pins P4 and may exchange data with the host 200B based on the changed speed gear.

In some example embodiments, the host 200B may include the first through third pins P1' through P3', a reference clock frequency pin, and a mode pin; and the storage device 100B may include the first through third pins P1 through P3, a reference clock frequency pin, and a mode pin. In some example embodiments, the host 200B may include the first through third pins P1' through P3', a reference clock frequency pin, and a gear pin; and the storage device 100B may include the first through third pins P1 through P3, a reference clock frequency pin, and a gear pin. In some example embodiments, the host 200B may include the first through third pins P1' through P3', a mode pin, and a gear pin; and the storage device 100B may include the first through third pins P1 through P3, a mode pin, and a gear pin. In some example embodiments, the host 200B may include the first through third pins P1' through P3', a reference clock frequency pin, a mode pin, and a gear pin; and the storage device 100B may include the first through third pins P1 through P3, a reference clock frequency pin, a mode pin, and a gear pin. Example embodiments are not limited thereto; for example, one of ordinary skill in the art may recognize other potential mappings between the gear rate and the gear signal GS.

Figure 24:
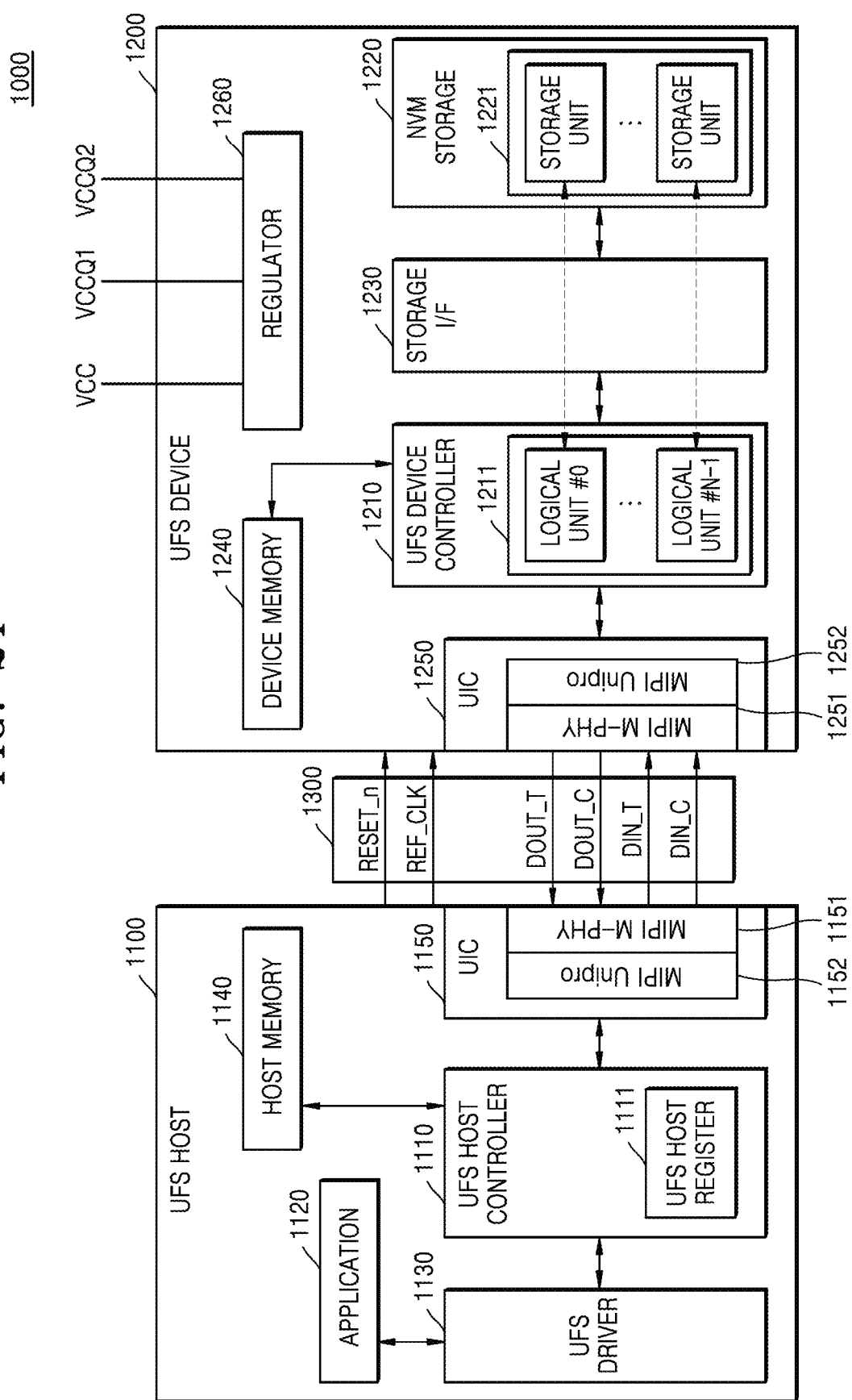
FIG. 24 is a diagram of a UFS system according to some example embodiments.

FIG. 24 is a diagram of a UFS system 1000 according to some example embodiments. The UFS system 1000 complies with UFS standards published by Joint Electron Device Engineering Council (JEDEC) and may include a UFS host 1100, a UFS device 1200, and a UFS interface 1300. The descriptions given above about the storage systems 10, 10A, and 10 of FIGS. 1, 3, and 20 may also be applied to the UFS system 1000 of FIG. 24 unless the descriptions contradict descriptions given below with reference to FIG. 24.

Referring to FIG. 24, the UFS host 1100 and the UFS device 1200 may be connected to each other through the UFS interface 1300. When the host 200 in FIG. 1 is an AP, the UFS host 1100 may be implemented as a part of the AP. A UFS host controller 1110 may correspond to the host controller 220 in FIG. 1. The UFS device 1200 may correspond to the storage device 100 in FIG. 1, and a UFS device controller 1210 and an NVM storage 1220 may respectively correspond to the device controller 120 and the NVM 130 in FIG. 1.

The UFS host 1100 may include the UFS host controller 1110, an application 1120, a UFS driver 1130, a host memory 1140, and a UFS interconnect (UIC) layer 1150. The UFS device 1200 may include the UFS device controller 1210, the NVM storage 1220, a storage interface 1230, a device memory 1240, a UIC layer 1250, and a regulator 1260. The NVM storage 1220 may include a plurality of storage units 1221. The storage units 1221 may be or include vertical NAND (VNAND) flash memory in a two-dimensional (2D) and/or three-dimensional (3D) structure or other kinds of NVM such as PRAM and/or RRAM. The UFS device controller 1210 and the NVM storage 1220 may be connected to each other through the storage interface 1230. The storage interface 1230 may be implemented to comply with a standard protocol such as Toggle and/or ONFI.

The application 1120 may refer to a program for communicating with the UFS device 1200 to use a function of the UFS device 1200. The application 1120 may transmit an input-output request (IOR) for input/output of the UFS device 1200 to the UFS driver 1130. The IOR may include a data read request, a data write request, and/or a data discard request but is not limited thereto.

The UFS driver 1130 may manage the UFS host controller 1110 through a UFS-host controller interface (HCI). The UFS driver 1130 may convert an IOR, which is generated by the application 1120, into a UFS command defined by a UFS standard and may transmit the UFS command to the UFS host controller 1110. A single IOR may be converted into a plurality of UFS commands. A UFS command may be a command that is defined by the small computer small interface (SCSI) standard and/or an exclusive command for the UFS standard.

The UFS host controller 1110 may transmit the UFS command from the UFS driver 1130 to the UIC layer 1250 of the UFS device 1200 through the UIC layer 1150 and the UFS interface 1300. In this process, a UFS host register of the UFS host controller 1110 may function as a command queue.

The UIC layer 1150 of the UFS host 1100 may include a MIPI M-PHY 1151 and a MIPI UniPro 1152, and the UIC layer 1250 of the UFS device 1200 may also include a MIPI M-PHY 1251 and a MIPI UniPro 1252.

The UFS interface 1300 may include a line transmitting the reference clock signal REF_CLK, a line transmitting a hardware reset signal RESET_n for the UFS device 1200, a pair of lines transmitting a pair of differential input signals DIN_T and DIN_C, and a pair of lines transmitting a pair of differential output signals DOUT_T and DOUT_C.

The frequency value of the reference clock signal REF_CLK provided from the UFS host 1100 to the UFS device 1200 may be one of 19.2 MHz, 26 MHz, 38.4 MHz, and 52 MHz but is not limited thereto. The UFS host 1100 may change the frequency value of the reference clock signal REF_CLK even while operating or exchanging data with the UFS device 1200. The UFS device 1200 may generate clock signals having different frequencies from the reference clock signal REF_CLK, which is received from the UFS host 1100, using a phase-locked loop (PLL) or the like. The UFS host 1100 may set a value of a data rate between the UFS host 1100 and the UFS device 1200 using the frequency value of the reference clock signal REF_CLK. In other words, the value of the data rate may be determined depending on the frequency value of the reference clock signal REF_CLK.

The UFS interface 1300 may support multiple lanes, and each of the lanes may correspond to/be implemented as a differential pair. For example, the UFS interface 1300 may include at least one receive lane and at least one transmit lane. In FIG. 24, a pair of lines transmitting the pair of differential input signals DIN_T and DIN_C may form a receive lane, and a pair of lines transmitting the pair of differential output signals DOUT_T and DOUT_C may form a transmit lane. Although one transmit lane and one receive lane are illustrated in FIG. 24, the numbers of transmit lanes and receive lanes may be changed.

A receive lane and a transmit lane may transmit data serially, in a serial communication mode. Because the receive lane is separated from the transmit lane, the UFS host 1100 may communicate with the UFS device 1200 in a full-duplex mode For example, the UFS device 1200 may transmit data to the UFS host 1100 through the transmit lane even while receiving data from the UFS host 1100 through the receive lane. Control data such as a command from the UFS host 1100 to the UFS device 1200 may be transmitted through the same lane as user data, which the UFS host 1100 writes to or reads from the NVM storage 1220 of the UFS device 1200. Accordingly, other lanes for data transmission than a pair of a receive lane and a transmit lane are not necessary between the UFS host 1100 and the UFS device 1200.

The UFS device controller 1210 of the UFS device 1200 may generally control operations of the UFS device 1200. The UFS device controller 1210 may manage the NVM storage 1220 using a logical unit 1211 corresponding to a logical data storage unit. The number of logical units 1211 may be eight but is not limited thereto. The UFS device controller 1210 may include a flash translation layer (FTL) and may translate a logical address data, e.g., a logical block address (LBA), received from the UFS host 1100 into a physical data address, e.g., a physical block address (PBA), using address mapping information of the FTL. A logical block for storing user data in the UFS system 1000 may have a size in a certain range. For example, a size such as a minimum size of a logical block may be set to 4 Kbytes.

When a command from the UFS host 1100 is input to the UFS device 1200 through the UIC layer 1250, the UFS device controller 1210 may perform an operation corresponding to the command and transmit a completion response to the UFS host 1100 after the operation is completed.

For example, when the UFS host 1100 writes user data in the UFS device 1200, the UFS host 1100 may transmit a data write command to the UFS device 1200. When the UFS host 1100 receives a response corresponding to ready-to-transfer from the UFS device 1200, the UFS host 1100 may transmit the user data to the UFS device 1200. The UFS device controller 1210 may temporarily store the user data in the device memory 1240 and may write the user data temporarily stored in the device memory 1240 to a selected position of the NVM storage 1220.

In some example embodiments, when the UFS host 1100 reads user data from the UFS device 1200, the UFS host 1100 may transmit a data read command to the UFS device 1200. The UFS device controller 1210 may receive the data read command, read the user data from the NVM storage 1220 based on the data read command, and temporarily store the user data, which has been read, in the device memory 1240. In this read operation, the UFS device controller 1210 may detect and correct an error in the user data, which has been read, using an embedded error correction code (ECC) engine (not shown). In detail, the ECC engine may generate parity bits with respect to data to be written to the NVM storage 1220, and the parity bits may be stored in the NVM storage 1220 together with the data. When data is read from the NVM storage 1220, the ECC engine may correct an error in the data using parity bits, which are read from the NVM storage 1220 together with the data, and may output error-corrected read data.

The UFS device controller 1210 may transmit the user data, which has been temporarily stored in the device memory 1240, to the UFS host 1100. The UFS device controller 1210 may further include an advanced encryption standard (AES) engine (not shown). The AES engine may perform at least one selected from encryption and decryption of data input to the UFS device controller 1210 using a symmetric-key algorithm.

The UFS host 1100 may store commands to be transmitted to the UFS device 1200 in the UFS host register 1111, which may function as a command queue, in order and transmit the commands to the UFS device 1200 in the order. At this time, even while a command transmitted to the UFS device 1200 is being processed by the UFS device 1200, i.e., even before the UFS host 1100 is notified that a command transmitted to the UFS device 1200 has been completely processed by the UFS device 1200, the UFS host 1100 may transmit a subsequent command in the command queue to the UFS device 1200, and the UFS device 1200 may receive the subsequent command from the UFS host 1100 even while processing the command received before. Queue depth, i.e., the maximum number of commands that may be stored in the command queue, may be 32. The command queue may be a circular queue, in which a head pointer and a tail pointer respectively indicate the beginning and end of a command sequence stored therein.

Each of the storage units 1221 may include a memory cell array (not shown) and a control circuit (not shown), which controls the operation of the memory cell array. The memory cell array may include a 2D memory cell array or a 3D memory cell array. The memory cell array includes a plurality of memory cells. Each of the memory cells may be a single-level cell (SLC) storing one bit of information or a cell, such as a multi-level cell (MLC), a triple-level cell (TLC), or a quadruple-level cell (QLC), which stores at least two bits of information. A 3D memory cell array may include a vertically-oriented NAND string, in which at least one memory cell is arranged above another memory cell.

Supply voltages VCC, VCCQ, and VCCQ2 may be input to the UFS device 1200. The supply voltage VCC may be a main supply voltage for the UFS device 1200 and may have a value of about 2.4 V to about 3.6 V. The supply voltage VCCQ may be used for supply of a voltage in a low range and mainly used for the UFS device controller 1210. The supply voltage VCCQ may have a value of about 1.14 V to about 1.26 V. The supply voltage VCCQ2 may be used to supply a voltage that is lower than the supply voltage VCC and higher than the supply voltage VCCQ and mainly used for an input/output interface such as the MIPI M-PHY 1251. The supply voltage VCCQ2 may have a value of about 1.7 V to about 1.95 V. Each of the supply voltages VCC, VCCQ, and VCCQ2 may be supplied to a corresponding element of the UFS device 1200 through the regulator 1260. The regulator 1260 may be implemented as a group of regulator units respectively connected to the supply voltages VCC, VCCQ, and VCCQ2.

Figure 25A:
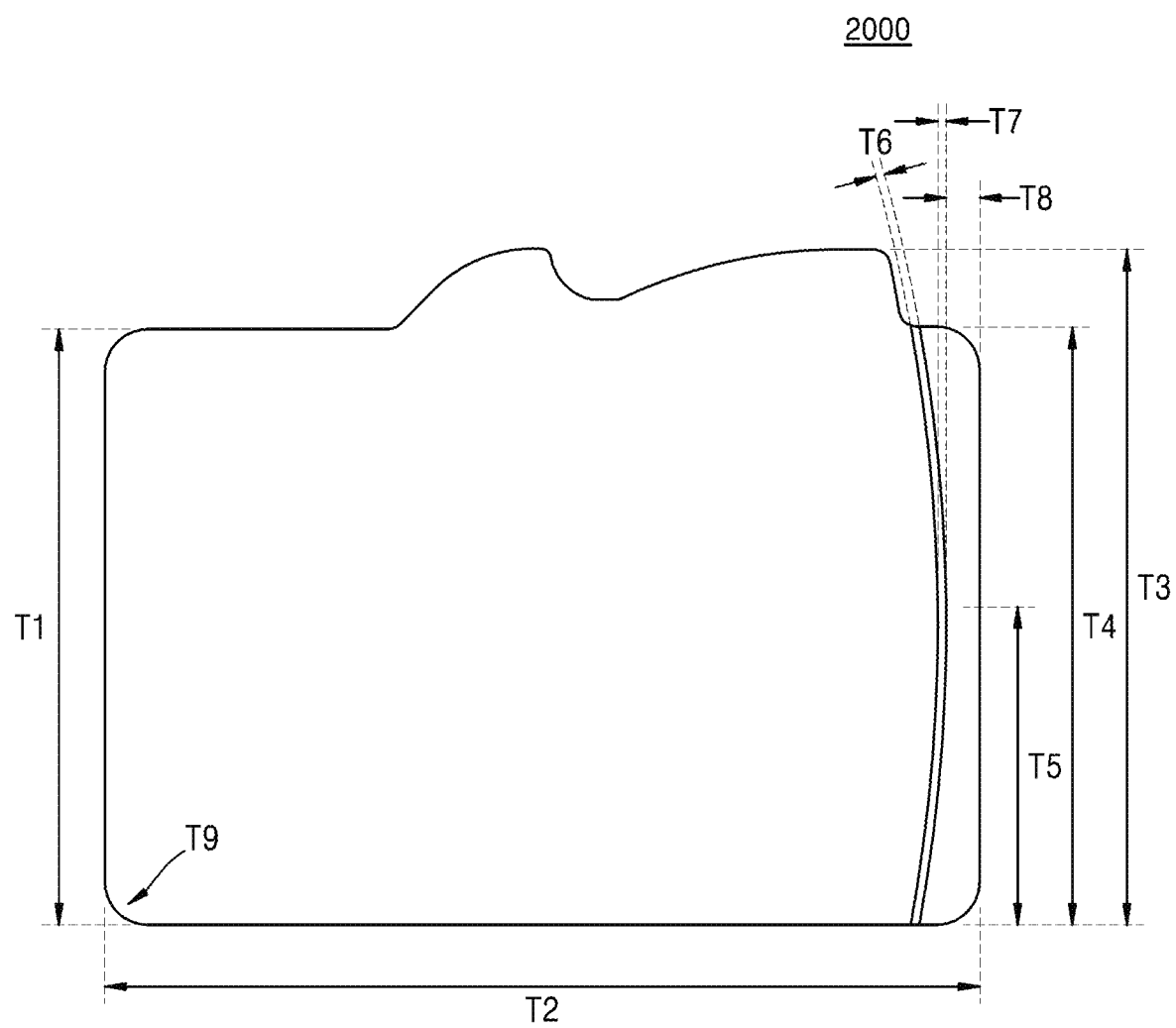
FIGS. 25A through 25C are diagrams for describing a form factor of a UFS card.
Figure 25B:
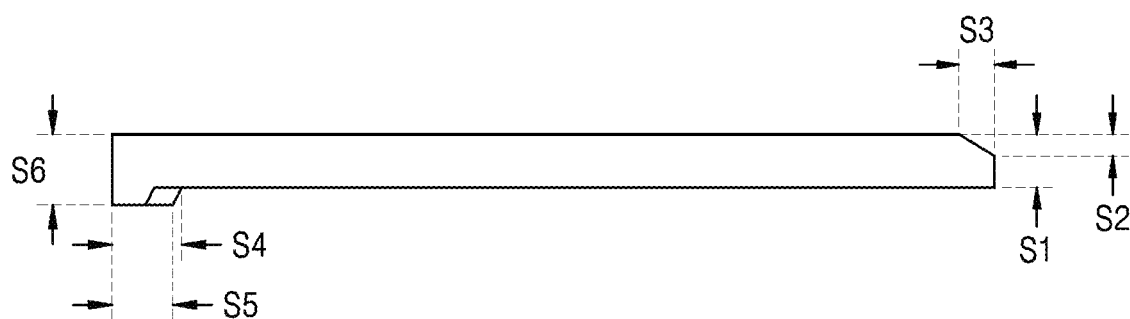
Figure 25C:
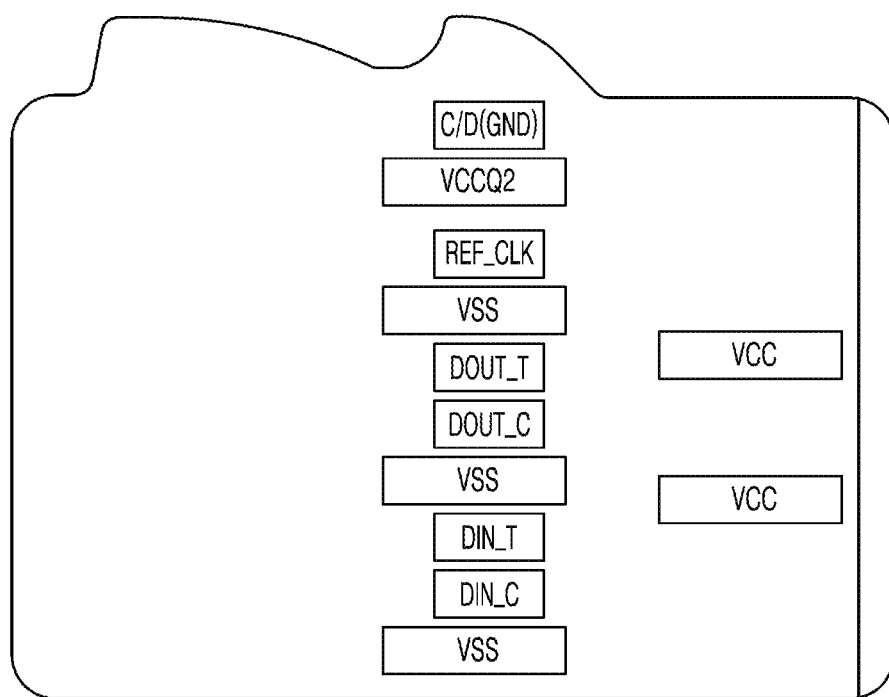

FIGS. 25A through 25C are diagrams for describing a form factor of a UFS card. When the UFS device 1200 described with reference to FIG. 24 is implemented in a form of a UFS card 2000, the outer shape of the UFS card 2000 may be as shown in FIGS. 25A through 25C.

FIG. 25A illustrates a top view of the UFS card 2000. Referring to FIG. 25A, it may be seen that the UFS card 2000 conforms to the design of a shark in general. In relation to FIG. 25A, the UFS card 2000 may have dimensions shown in Table 1.

TABLE 1

| Item | Dimension (mm) |
|------|----------------|
| T1 | 9.70 |
| T2 | 15.00 |
| T3 | 11.00 |
| T4 | 9.70 |
| T5 | 5.15 |
| T6 | 0.25 |
| T7 | 0.60 |
| T8 | 0.75 |
| T9 | R0.80 |

FIG. 25B illustrates a side view of the UFS card 2000. In relation to FIG. 25B, the UFS card 2000 may have dimensions shown in Table 2.

TABLE 2

| Item | Dimension (mm) |
|------|----------------|
| S1 | 0.74 ± 0.06 |
| S2 | 0.30 |
| S3 | 0.52 |
| S4 | 1.20 |
| S5 | 0.05 |
| S6 | 1.00 |

FIG. 25C illustrates a bottom view of the UFS card 2000. Referring to FIG. 25C, a plurality of pins electrically connecting to a UFS slot may be formed in the bottom of the UFS card 2000, and the function of each pin will be described below. Based on the symmetry between the top and the bottom of the UFS card 2000, some (e.g., T1 through T5 and T9) of the information about the dimensions described with reference to FIG. 25A and Table 1 may also be applied to the bottom view of the UFS card 2000 of FIG. 25C.

A plurality of pins electrically connected to a UFS host may be formed in the bottom of the UFS card 2000, and the total number of pins may be 12 according to FIG. 25C. Each of the pins may have a quadrilateral/rectangular shape and/or may have beveled corners, and a signal name corresponding to each pin is shown in FIG. 25C. Table 3 may be referred to for general information about each pin.

TABLE 3

| No. | Signal name | Description | Dimension (mm) |
|-----|-------------|-------------|----------------|
| 1 | VSS | Ground (GND) | 3.00 × 0.72 ± 0.05 |
| 2 | DIN_C | Differential input signals input from a host to the UFS card 2000 (DIN_C is a negative node and DIN_T is a positive node) | 1.50 × 0.72 ± 0.05 |
| 3 | DIN_T | | |
| 4 | VSS | Same as No. 1 | 3.00 × 0.72 ± 0.05 |
| 5 | DOUT_C | Differential output signals output from the UFS card 2000 to the host (DOUT_C is a negative node and DOUT_T is a positive node) | 1.50 × 0.72 ± 0.05 |
| 6 | DOUT_T | | |
| 7 | VSS | Same as No. 1 | 3.00 × 0.72 ± 0.05 |
| 8 | REF_CLK | Reference clock signal provided from the host to the UFS card 2000 | 1.50 × 0.72 ± 0.05 |
| 9 | VCCQ2 | Supply voltage provided mainly for a PHY interface or a controller and having a lower value than VCC. | 3.00 × 0.72 ± 0.05 |
| 10 | C/D(GND) | Signal for card detection | 1.50 × 0.72 ± 0.05 |
| 11 | VSS | Same as No. 1 | 3.00 × 0.80 ± 0.05 |
| 12 | VCC | Main supply voltage | |

Figure 26:
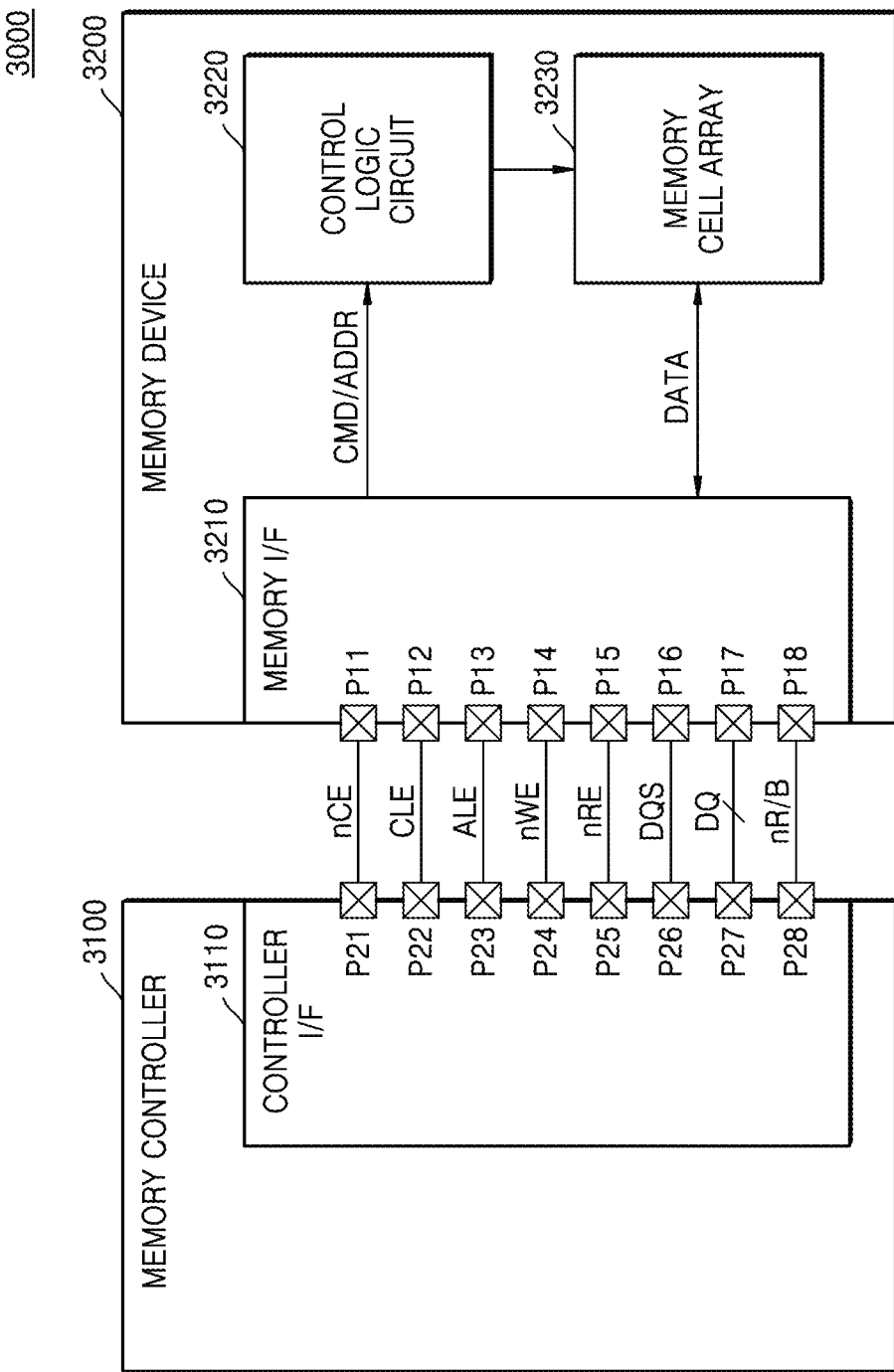
FIG. 26 is a block diagram of a memory system according to some example embodiments.

FIG. 26 is a block diagram of a memory system 3000 according to some example embodiments.

Referring to FIG. 26, the memory system 3000 may include a memory device 3200 and a memory controller 3100. The memory device 3200 may correspond to an NVM device, which communicates with the memory controller 3100 based on one of a plurality of channels. For example, the memory device 3200 may correspond to the NVM 130 in FIG. 1, and the memory controller 3100 may correspond to the device controller 120 in FIG. 1.

The memory device 3200 may include first through eighth pins P11 through P18, a memory interface circuit 3210, a control logic circuit 3220, and a memory cell array 3230. The memory interface circuit 3210 may receive a chip enable signal nCE from the memory controller 3100 through the first pin P11. The memory interface circuit 3210 may exchange signals with the memory controller 3100 through the second through eighth pins P12 through P18 according to the chip enable signal nCE. For example, when the chip enable signal nCE is enabled (e.g., at a low level), the memory interface circuit 3210 may exchange signals with the memory controller 3100 through the second through eighth pins P12 through P18 according to the chip enable signal nCE.

The memory interface circuit 3210 may receive a command latch enable signal CLE, an address latch enable signal ALE, and a write enable signal nWE from the memory controller 3100 through the second through fourth pins P12 through P14, respectively. The memory interface circuit 3210 may receive or transmit a data signal DQ from or to the memory controller 3100 through the seventh pin P17. The command CMD, an address ADDR, and data DATA may be transmitted through the data signal DQ. For example, the data signal DQ may be transmitted through a plurality of data signal lines. In this case, the seventh pin P17 may include a plurality of pins respectively corresponding to the data signal lines.

The memory interface circuit 3210 may acquire the command CMD from the data signal DQ, which is received in an enable period (e.g., a high level state) of the command latch enable signal CLE, based on toggle timings of the write enable signal nWE. The memory interface circuit 3210 may acquire the address ADDR from the data signal DQ, which is received in an enable period (e.g., a high level state) of the address latch enable signal ALE, based on the toggle timings of the write enable signal nWE.

In an example embodiment, the write enable signal nWE may remain in a static state (e.g., a high level or a low level) and toggle between the high level and the low level. For example, the write enable signal nWE may toggle in a period in which the command CMD or the address ADDR is transmitted. Accordingly, the memory interface circuit 3210 may acquire the command CMD or the address ADDR based on the toggle timings of the write enable signal nWE.

The memory interface circuit 3210 may receive a read enable signal nRE from the memory controller 3100 through the fifth pin P15. The memory interface circuit 3210 may receive or transmit a data strobe signal DQS from or to the memory controller 3100 through the sixth pin P16.

In a data output operation of the memory device 3200, the memory interface circuit 3210 may receive the read enable signal nRE, which toggles, through the fifth pin P15 before outputting the data DATA. The memory interface circuit 3210 may generate the data strobe signal DQS, which toggles, based on toggling of the read enable signal nRE. For example, the memory interface circuit 3210 may generate the data strobe signal DQS, which starts toggling after a certain delay (e.g., tDQSRE) from a toggling start time of the read enable signal nRE. The memory interface circuit 3210 may transmit the data signal DQ including the data DATA based on toggle timings of the data strobe signal DQS. Accordingly, the data DATA may be transmitted to the memory controller 3100 in alignment with the toggle timings of the data strobe signal DQS.

In a data input operation of the memory device 3200, when the data signal DQ including the data DATA is received from the memory controller 3100, the memory interface circuit 3210 may receive the data strobe signal DQS, which toggles, from the memory controller 3100 together with the data DATA. The memory interface circuit 3210 may acquire the data DATA from the data signal DQ based on the toggle timings of the data strobe signal DQS. For example, the memory interface circuit 3210 may acquire the data DATA by sampling the data signal DQ at rising and falling edges of the data strobe signal DQS.

The memory interface circuit 3210 may transmit a ready/busy output signal nR/B to the memory controller 3100 through the eighth pin P18. The memory interface circuit 3210 may transmit state information of the memory device 3200 to the memory controller 3100 through the ready/busy output signal nR/B. When the memory device 3200 is in a busy state (for example, when internal operations of the memory device 3200 are being performed), the memory interface circuit 3210 may transmit the ready/busy output signal nR/B indicating the busy state to the memory controller 3100. When the memory device 3200 is in a ready state (that is, when internal operations of the memory device 3200 are not performed or are completed), the memory interface circuit 3210 may transmit the ready/busy output signal nR/B indicating the ready state to the memory controller 3100. For example, while the memory device 3200 is reading the data DATA from the memory cell array 3230 in response to a read command, the memory interface circuit 3210 may transmit the ready/busy output signal nR/B indicating the busy state (e.g., a low level) to the memory controller 3100. For example, while the memory device 3200 is programming the data DATA to the memory cell array 3230 in response to a program command, the memory interface circuit 3210 may transmit the ready/busy output signal nR/B indicating the busy state to the memory controller 3100.

The control logic circuit 3220 may generally control various operations of the memory device 3200. The control logic circuit 3220 may receive the command CMD and/or the address ADDR from the memory interface circuit 3210. The control logic circuit 3220 may generate control signals for controlling other elements of the memory device 3200 according to the command CMD and/or the address ADDR. For example, the control logic circuit 3220 may generate various control signals for programming the data DATA to the memory cell array 3230 or reading the data DATA from the memory cell array 3230.

The memory cell array 3230 may store the data DATA from the memory interface circuit 3210 under the control of the control logic circuit 3220. The memory cell array 3230 may output the data DATA, which has been stored therein, to the memory interface circuit 3210 under the control of the control logic circuit 3220.

The memory cell array 3230 may include a plurality of memory cells. For example, the memory cells may include flash memory cells. However, embodiments are not limited thereto. The memory cells may include at least one of RRAM cells, ferroelectric RAM (FRAM) cells, PRAM cells, thyristor RAM (TRAM) cells, or MRAM cells. Hereinafter, example embodiments will be described focusing on the case where the memory cells include NAND flash memory cells.

The memory controller 3100 may include first through eighth pins P21 through P28 and a controller interface circuit 3110. The first through eighth pins P21 through P28 may respectively correspond to the first through eighth pins P11 through P18 of the memory device 3200. The controller interface circuit 3110 may transmit the chip enable signal nCE to the memory device 3200 through the first pin P21. The controller interface circuit 3110 may exchange signals with the memory device 3200 through the second through eighth pins P22 through P28 according to the chip enable signal nCE.

The controller interface circuit 3110 may transmit the command latch enable signal CLE, the address latch enable signal ALE, and the write enable signal nWE to the memory device 3200 through the second through fourth pins P22 through P24, respectively. The controller interface circuit 3110 may transmit and/or receive the data signal DQ to and/or from the memory device 3200 through the seventh pin P27.

The controller interface circuit 3110 may transmit the data signal DQ, which includes the command CMD or the address ADDR, to the memory device 3200 together with the write enable signal nWE, which toggles. The controller interface circuit 3110 may transmit the data signal DQ including the command CMD to the memory device 3200 by transmitting the command latch enable signal CLE, which is in the enable state, and may transmit the data signal DQ including the address ADDR to the memory device 3200 by transmitting the address latch enable signal ALE, which is in the enable state.

The controller interface circuit 3110 may transmit the read enable signal nRE to the memory device 3200 through the fifth pin P25. The controller interface circuit 3110 may receive or transmit the data strobe signal DQS from or to the memory device 3200 through the sixth pin P26.

In a data output operation of the memory device 3200, the controller interface circuit 3110 may generate and transmit the read enable signal nRE, which toggles, to the memory device 3200. For example, before the output of the data DATA, the controller interface circuit 3110 may generate the read enable signal nRE, which is converted from a static state (e.g., a high level or a low level) into a toggling state. Accordingly, the memory device 3200 may generate the data strobe signal DQS, which toggles, based on the read enable signal nRE. The controller interface circuit 3110 may receive the data signal DQ including the data DATA and the data strobe signal DQS, which toggles, from the memory device 3200. The controller interface circuit 3110 may acquire the data DATA from the data signal DQ based on the toggle timings of the data strobe signal DQS.

In a data input operation of the memory device 3200, the controller interface circuit 3110 may generate the data strobe signal DQS, which toggles. For example, before transmitting the data DATA, the controller interface circuit 3110 may generate the data strobe signal DQS, which is converted from a static state (e.g., a high level or a low level) into a toggling state. The controller interface circuit 3110 may transmit the data signal DQ including the data DATA to the memory device 3200 based on the toggle timings of the data strobe signal DQS.

The controller interface circuit 3110 may receive the ready/busy output signal nR/B from the memory device 3200 through the eighth pin P28. The controller interface circuit 3110 may determine state information of the memory device 3200 based on the ready/busy output signal nR/B.

Figure 27:
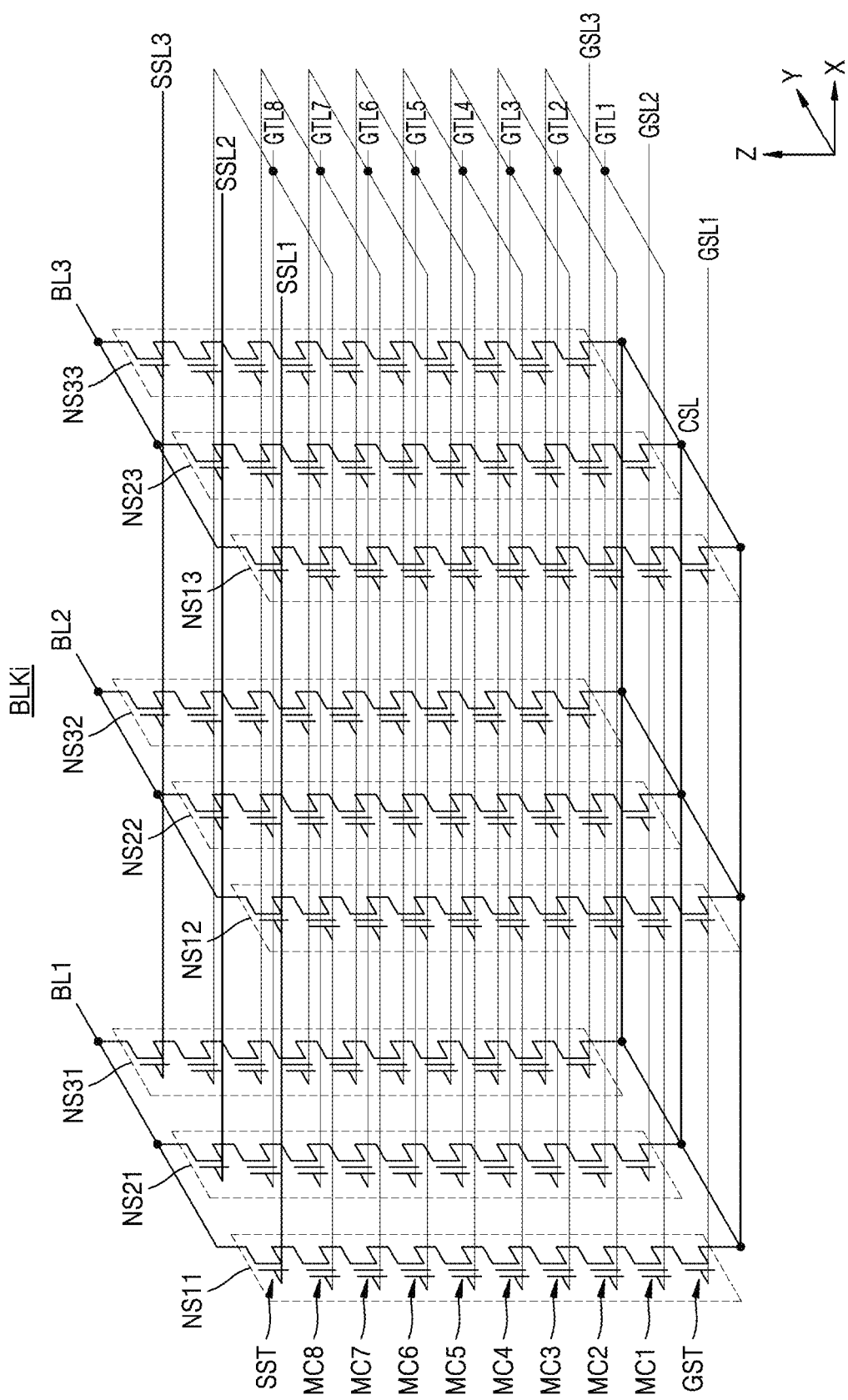
FIG. 27 is a diagram for describing a three-dimensional (3D) vertical NAND (VNAND) structure applicable to a UFS device, according to some example embodiments.

FIG. 27 is a diagram for describing a 3D VNAND structure applicable to a UFS device, according to some example embodiments. When a storage module of the UFS device is implemented by 3D VNAND-type flash memory, each of a plurality of memory blocks of the storage module may be represented by an equivalent circuit, as shown in FIG. 27. A memory block BLKi illustrated in FIG. 27 represents a 3D memory block having a 3D structure on a substrate. For example, a plurality of memory NAND strings of the memory block BLKi may be formed in a direction perpendicular to the substrate.

Referring to FIG. 27, the memory block BLKi may include a plurality of memory NAND strings NS11 through NS33 between bit lines BL1, BL2, and BL3 and a common source line CSL. Each of the memory NAND strings NS11 through NS33 may include a string selection transistor SST, a plurality of memory cells MC1 through MC8, and a ground selection transistor GST. Although each of the memory NAND strings NS11 through NS33 includes eighth memory cells MC1 through MC8 in FIG. 27, example embodiments are not limited thereto.

The string selection transistor SST may be connected to a corresponding one of string selection lines SSL1, SSL2, and SSL3. The memory cells MC1 through MC8 may be respectively connected to corresponding gate lines GTL1 through GTL8. The gate lines GTL1 through GTL8 may correspond to word lines, and some of the gate lines GTL1 through GTL8 may correspond to dummy word lines. The ground selection transistor GST may be connected to a corresponding one of ground selection lines GSL1, GSL2, and GSL3. The string selection transistor SST may be connected to a corresponding one of the lines BL1, BL2, and BL3, and the ground selection transistor GST may be connected to the common source line CSL.

Gate lines (e.g., GTL1) at the same height may be connected in common to one another, and the ground selection lines GSL1, GSL2, and GSL3 and the string selection lines SSL1, SSL2, and SSL3 may be separated from one another. Although the memory block BLKi are connected to the eight gate lines GTL1 through GTL8 and three lines BL1, BL2, and BL3 in FIG. 27, example embodiments are not limited thereto.

Figure 28:
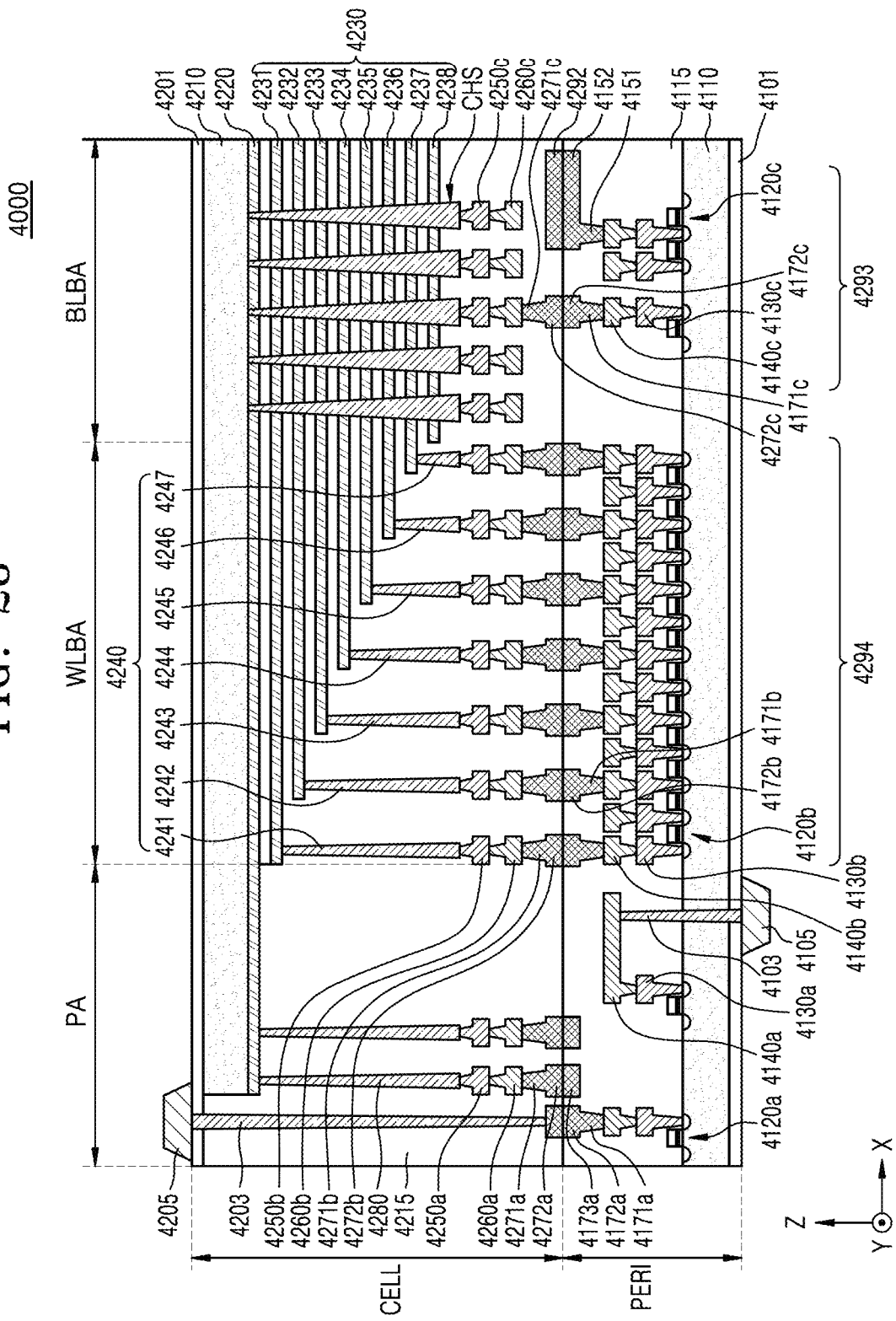
FIG. 28 is a diagram for describing a bonding VNAND (B-VNAND) structure applicable to a UFS device, according to some example embodiments.

FIG. 28 is a diagram for describing a bonding VNAND (B-VNAND) structure applicable to a UFS device, according to some example embodiments. When NVM included in the UFS device is implemented by a B-VNAND type flash memory, the NVM may have the structure illustrated in FIG. 28.

Referring to FIG. 28, a memory device 4000 may have a chip-to-chip (C2C) structure. In the C2C structure, an upper chip including a cell area CELL may be formed on a first wafer such as a first silicon wafer/substrate, a lower chip including a peripheral circuit area PERI may be formed on a second wafer such as a second silicon wafer/substrate that is different from the first wafer, and the upper chip may be connected to the lower chip using a bonding method. For example, the bonding method may include a method of electrically connecting a bonding metal formed in a topmost metal layer of the upper chip to a bonding metal formed in a topmost metal layer of the lower chip. For example, when the bonding metal includes copper (Cu), the bonding method may include a Cu—Cu bonding method. The bonding metal may include aluminum or tungsten.

Each of the peripheral circuit area PERI and the cell area CELL of the memory device 4000 may include an external pad bonding area PA, a word line bonding area WLBA, and a bit line bonding area BLBA.

The peripheral circuit area PERI may include a first substrate 4110, an interlayer insulating layer 4115, a plurality of circuit devices 4120*a*, 4120*b*, and 4120*c* formed in the first substrate 4110, first metal layers 4130*a*, 4130*b*, and 4130*c* respectively connected to the circuit devices 4120*a*, 4120*b*, and 4120*c*, and second metal layers 4140*a*, 4140*b*, and 4140*c* respectively formed on the first metal layers 4130*a*, 4130*b*, and 4130*c*. In some example embodiments, the first metal layers 4130*a*, 4130*b*, and 4130*c* may include tungsten having a relatively higher resistance, and the second metal layers 4140*a*, 4140*b*, and 4140*c* may include copper having a relatively lower resistance.

As described herein, only the first metal layers 4130*a*, 4130*b*, and 4130*c* and the second metal layers 4140*a*, 4140*b*, and 4140*c* are illustrated and described, but embodiments are not limited thereto. At least one metal layer may be further formed on the second metal layers 4140*a*, 4140*b*, and 4140*c*. At least a portion of the at least one metal layer on the second metal layers 4140*a*, 4140*b*, and 4140*c* may include aluminum, which has a lower resistance than copper included in the second metal layers 4140*a*, 4140*b*, and 4140*c*.

The interlayer insulating layer 4115 may be arranged on the first substrate 4110 to cover the circuit devices 4120*a*, 4120*b*, and 4120*c*, the first metal layers 4130*a*, 4130*b*, and 4130*c*, and the second metal layers 4140*a*, 4140*b*, and 4140*c* and may include an insulating material such as silicon oxide and/or silicon nitride.

Lower bonding metals 4171*b* and 4172*b* may be formed on the second metal layer 4140*b* in the word line bonding area WLBA. In the word line bonding area WLBA, the lower bonding metals 4171*b* and 4172*b* of the peripheral circuit area PERI may be electrically connected to upper bonding metals 4271*b* and 4272*b* of the cell area CELL using a bonding method. The lower bonding metals 4171*b* and 4172*b* and the upper bonding metals 4271*b* and 4272*b* may include at least one of aluminum, copper, or tungsten.

The cell area CELL may provide/include at least one memory block. The cell area CELL may include a second substrate 4210 and a common source line 4220. A plurality of word lines 4231 through 4238 (collectively denoted by 4230) may be stacked on the second substrate 4210 in a direction (e.g., a Z-axis direction) perpendicular to a top surface of the second substrate 4210. String selection lines may be arranged above the word lines 4230 and a ground selection line may be arranged below the word lines 4230. The word lines 4230 may be arranged between the string selection lines and the ground selection line.

In the bit line bonding area BLBA, a channel structure CHS may extend in the direction perpendicular to the top surface of the second substrate 4210 and pass through the word lines 4230, the string selection lines, and the ground selection line. The channel structure CHS may include a data storage layer, a channel layer, and a buried insulating layer. The channel layer may be electrically connected to a first metal layer 4250*c* and a second metal layer 4260*c*. For example, the first metal layer 4250*c* may correspond to a bit line contact, and the second metal layer 4260*c* may correspond to a bit line and may be referred to as a bit line 4260*c* below. In some example embodiments, the bit line 4260*c* may extend in a first direction (e.g., a Y-axis direction) parallel with the top surface of the second substrate 4210.

As described with reference to FIG. 28, an area, in which the channel structure CHS and the bit line 4260*c* are arranged, may be defined as the bit line bonding area BLBA. The bit line 4260*c* may be electrically connected to circuit devices 4120*c*, which provide a page buffer 4293 in the peripheral circuit area PERI, in the bit line bonding area BLBA. For example, the bit line 4260*c* may be connected to upper bonding metals 4271*c* and 4272*c* in the bit line bonding area BLBA, and the upper bonding metals 4271*c* and 4272*c* may be connected to lower bonding metals 4171*c* and 4172*c* connected to the circuit devices 4120*c* of the page buffer 4293.

In the word line bonding area WLBA, the word lines 4230 may extend in a second direction (e.g., an X-axis direction) parallel with the top surface of the second substrate 4210 and may be connected to a plurality of cell contact plugs 4241 through 4247 (collectively denoted by 4240). The word lines 4230 may be connected to the cell contact plugs 4240 through pads, which are provided by at least some of the word lines 4230 extending in different lengths in the second direction. A first metal layer 4250*b* and a second metal layer 4260*b* may be sequentially stacked on each of the cell contact plugs 4240 connected to the word lines 4230. The cell contact plugs 4240 in the word line bonding area WLBA may be connected to the peripheral circuit area PERI through the upper bonding metals 4271*b* and 4272*b* of the cell area CELL and the lower bonding metals 4171*b* and 4172*b* of the peripheral circuit area PERI.

The cell contact plugs 4240 may be electrically connected to circuit devices 4120*b*, which provide a row decoder 4294 in the peripheral circuit area PERI. In some example embodiments, operating voltages of the circuit devices 4120*b* providing the row decoder 4294 may be different from operating voltages of the circuit devices 4120*c* providing the page buffer 4293. For example, the operating voltages of the circuit devices 4120*c* providing the page buffer 4293 may be greater than the operating voltages of the circuit devices 4120*b* providing the row decoder 4294.

A common source line contact plug 4280 may be arranged in the external pad bonding area PA. The common source line contact plug 4280 may include a conductive material such as at least one of metal, a metal compound, or polysilicon such as doped polysilicon and may be electrically connected to the common source line 4220. A first metal layer 4250*a* and a second metal layer 4260*a* may be sequentially stacked on the common source line contact plug 4280. For example, an area, in which the common source line contact plug 4280, the first metal layer 4250*a*, and the second metal layer 4260*a* are arranged, may be defined as the external pad bonding area PA.

First and second input/output pads 4105 and 4205 may be arranged in the external pad bonding area PA. Referring to FIG. 28, a lower insulating film 4101 covering a bottom surface of the first substrate 4110 may be formed below the first substrate 4110, and the first input/output pad 4105 may be formed on the lower insulating film 4101. The first input/output pad 4105 may be connected to at least one of the circuit devices 4120*a*, 4120*b*, and 4120*c* of the peripheral circuit area PERI through a first input/output contact plug 4103 and may be isolated from the first substrate 4110 by the lower insulating film 4101. A side insulating film may be arranged between the first input/output contact plug 4103 and the first substrate 4110 to electrically isolate the first input/output contact plug 4103 from the first substrate 4110.

Referring to FIG. 28, an upper insulating film 4201 covering a top surface of the second substrate 4210 may be formed above the second substrate 4210, and the second input/output pad 4205 may be arranged on the upper insulating film 4201. The second input/output pad 4205 may be connected to at least one of the circuit devices 4120*a*, 4120*b*, and 4120*c* of the peripheral circuit area PERI through a second input/output contact plug 4203. For example, the second input-output contact plug 4203 may be connected to the circuit element 4120*a* through lower bonding metals 4171*a* and 4172*a*.

According to some example embodiments, the second substrate 4210 and the common source line 4220 may not be arranged in an area in which the second input/output contact plug 4203 is arranged. The second input/output pad 4205 may not overlap the word lines 4230 in a third direction (e.g., the Z-axis direction). Referring to FIG. 28, the second input/output contact plug 4203 may be separated from the second substrate 4210 in the direction parallel with the top surface of the second substrate 4210 and may pass through an interlayer insulating layer 4215 of the cell area CELL to be connected to the second input/output pad 4205.

According to some example embodiments, the first input/output pad 4105 and the second input/output pad 4205 may be selectively formed. For example, the memory device 400 may include only the first input/output pad 4105 on the first substrate 4110 or only the second input/output pad 4205 on the second substrate 4210. Alternatively, the memory device 4000 may include both the first input/output pad 4105 and the second input/output pad 4205.

A metal pattern of a topmost metal layer may be provided as a dummy pattern in the external pad bonding area PA of each of the cell area CELL and the peripheral circuit area PERI, or the topmost metal layer may be empty.

In correspondence to an upper metal pattern 4272*a* in the topmost metal layer of the cell area CELL, a lower metal pattern 4173a having the same shape as upper metal pattern 4272a of the cell area CELL may be formed in a topmost metal layer of the peripheral circuit area PERI in the external pad bonding area PA. The lower metal pattern 4173a in the topmost metal layer of the peripheral circuit area PERI may not be connected to a contact in the peripheral circuit area PERI. Similarly, in correspondence to a lower metal pattern in the topmost metal layer of the peripheral circuit area PERI in the external pad bonding area PA, an upper metal pattern having the same shape as lower metal pattern of the peripheral circuit area PERI may be formed in the topmost metal layer of the cell area CELL.

The lower bonding metals 4171b and 4172b may be formed on the second metal layer 4140b in the word line bonding area WLBA. In the word line bonding area WLBA, the lower bonding metals 4171b and 4172b of the peripheral circuit area PERI may be electrically connected to the upper bonding metals 4271b and 4272b of the cell area CELL using a bonding method.

In correspondence to a lower metal pattern 4152 formed in the topmost metal layer of the peripheral circuit area PERI, in the bit line bonding area BLBA, an upper metal pattern 4292 having the same shape as the lower metal pattern 4152 of the peripheral circuit area PERI may be formed on the topmost metal layer of the cell area CELL. A contact may not be formed on the upper metal pattern 4292 in the topmost metal layer of the cell area CELL. For example, the lower metal pattern 4152 may be connected to the circuit element 4120c through a lower bonding metal 4151.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to embodiments thereof, it will be understood that various changes in form and details may be made therein without departing from the spirit and scope of the following claims.

What is claimed is:

1. A storage device comprising:
   a reference clock pin configured to receive a reference clock signal from a host during initialization and/or booting of the storage device;
   a reference clock frequency determination circuitry configured to determine a reference clock frequency from the reference clock signal received through the reference clock pin; and
   a device controller circuitry configured to perform a high speed mode link startup between the host and the storage device according to the reference clock frequency, during initialization and/or booting of the storage device, before exchanging data with the host,
   wherein the response to the high speed mode link startup being completed, the storage device and the host are set to a linkup state, in which the storage device is configured to exchange data with the host.

2. The storage device of claim 1, further comprising:
   an input signal pin configured to receive an input signal from the host; and
   an interconnect circuitry connected to the input signal pin and configured to exchange data with the host,
   wherein the device controller circuitry is further configured to set a physical layer of the interconnect circuitry according to the reference clock frequency.

3. The storage device of claim 2, wherein the reference clock frequency determination circuitry is further configured to transmit the reference clock frequency to a link layer of the interconnect circuitry.

4. The storage device of claim 2, wherein the interconnect circuitry includes the reference clock frequency determination circuitry.

5. The storage device of claim 1, wherein the device controller circuitry includes the reference clock frequency determination circuitry.

6. The storage device of claim 1, wherein the reference clock frequency determination circuitry includes a reference clock frequency counting circuitry configured to determine the reference clock frequency by comparing the reference clock signal with a system clock signal of the storage device.

7. The storage device of claim 6, wherein the reference clock frequency counting circuitry includes:
   a reference clock counting circuitry configured to generate a reference clock count value by counting a number of clocks in the reference clock signal during a frequency determination period;
   a system clock counting circuitry configured to generate a system clock count value by counting a number of clocks in the system clock signal during the frequency determination period; and
   a comparator circuitry configured to determine the reference clock frequency by comparing the reference clock count value with the system clock count value.

8. The storage device of claim 1, wherein the reference clock frequency determination circuitry includes:
   a first resistor-capacitor (RC) filter configured to generate, at a first time point, a first output voltage corresponding to the reference clock signal; and
   a second RC filter configured to generate, at a second time point, a second output voltage corresponding to the reference clock signal, the second time point being different from the first time point, and
   the reference clock frequency determination circuitry is configured to determine the reference clock frequency based on the first and second output voltages.

9. The storage device of claim 8, wherein the reference clock frequency determination circuitry further includes:
   a first monitor signal generating circuitry configured to generate a first monitor signal, the first monitor signal being enabled according to a level of the first output voltage at the first time point;
   a second monitor signal generating circuitry configured to generate a second monitor signal, the second monitor signal being enabled according to a level of the second output voltage at the second time point; and
   a monitor-based determination circuitry configured to determine the reference clock frequency based on the first and second monitor signals.

10. The storage device of claim 8, wherein the reference clock frequency determination circuitry further includes a frequency divider circuitry connected between the reference clock pin and the first and second RC filters and configured to generate a frequency-divided reference clock signal by frequency-dividing the reference clock signal, the first RC filter is configured to generate the first output voltage from the frequency-divided reference clock signal at the first time point corresponding to a first time constant, and the second RC filter is configured to generate the second output voltage from the frequency-divided reference clock signal at the second time point corresponding to a second time constant.

11. The storage device of claim 1, wherein the storage device includes a universal flash storage (UFS) device interconnected to the host according to a UFS standard.

12. A storage device comprising:
a reference clock pin configured to receive a reference clock signal from a host;
a reference clock frequency determination circuitry configured to determine a reference clock frequency from the reference clock signal received through the reference clock pin; and
a device controller circuitry configured, in response to the reference clock frequency changing from a first reference clock frequency to a second reference clock frequency in a linkup state between the host and the storage device, to dynamically change a speed gear between the host and the storage device according to the second reference clock frequency,
wherein the reference clock frequency determination circuitry includes:
a first resistor-capacitor (RC) filter configured to generate, at a first time point, a first output voltage corresponding to the reference clock signal; and
a second RC filter configured to generate, at a second time point, a second output voltage corresponding to the reference clock signal, the second time point being different from the first time point, and
the reference clock frequency determination circuitry is configured to determine the reference clock frequency based on the first and second output voltages.

13. The storage device of claim 12, further comprising:
an input signal pin configured to receive an input signal from the host; and
an interconnect circuitry connected to the input signal pin and configured to exchange data with the host,
wherein the device controller circuitry is further configured to set a physical layer of the interconnect circuitry according to the first reference clock frequency and reset the physical layer of the interconnect circuitry according to the second reference clock frequency.

14. The storage device of claim 13, wherein the reference clock frequency determination circuitry is further configured to:

(a) transmit the first reference clock frequency to a link layer of the interconnect circuitry, and
(b) to transmit the second reference clock frequency to the link layer of the interconnect circuitry.

15. The storage device of claim 13, wherein the interconnect circuitry includes the reference clock frequency determination circuitry.

16. The storage device of claim 12, wherein the device controller circuitry includes the reference clock frequency determination circuitry.

17. The storage device of claim 12, wherein the reference clock frequency determination circuitry includes a reference clock frequency counting circuitry configured to determine the reference clock frequency by comparing the reference clock signal with a system clock signal of the storage device.

18. The storage device of claim 12, wherein the storage device includes a universal flash storage (UFS) device interconnected to the host according to a UFS standard.

19. A storage device comprising:
a reference clock pin configured to receive a reference clock signal from a host during initialization and/or booting of the storage device;
at least one control signal pin configured to receive a control signal from the host; and
a device controller circuitry configured to perform a high speed mode link startup between the host and the storage device according to the control signal and/or to change a speed gear between the host and the storage device according to the control signal,
wherein the device controller circuitry is further configured to perform the high speed mode link startup between the host and the storage device according to the control signal, during initialization and/or booting of the storage device, before exchanging data with the host, and
wherein in response to the high speed mode link startup being completed, the storage device and the host are set to a linkup state, in which the storage device is configured to exchange data with the host.

20. The storage device of claim 19, wherein the at least one control signal pin includes at least one selected from:
a reference clock frequency pin configured to receive, from the host, a reference clock frequency signal indicating a frequency value of the reference clock signal;
a mode pin configured to receive a mode signal indicating an operation mode of the host; and
a gear pin configured to receive a gear signal indicating the speed gear between the host and the storage device.

* * * * *